United States Patent
Fujimaki

(10) Patent No.: US 12,068,572 B2
(45) Date of Patent: Aug. 20, 2024

(54) NARROWED-LINE GAS LASER APPARATUS AND METHOD FOR MANUFACTURING ELECTRONIC DEVICES

(71) Applicant: Gigaphoton Inc., Tochigi (JP)

(72) Inventor: Yosuke Fujimaki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 205 days.

(21) Appl. No.: 17/818,936

(22) Filed: Aug. 10, 2022

(65) Prior Publication Data

US 2022/0385030 A1 Dec. 1, 2022

Related U.S. Application Data

(63) Continuation of application No. PCT/JP2020/012547, filed on Mar. 19, 2020.

(51) Int. Cl.
| | |
|---|---|
| G03F 7/20 | (2006.01) |
| G03F 7/00 | (2006.01) |
| H01S 3/08 | (2023.01) |
| H01S 3/13 | (2006.01) |
| H01S 3/136 | (2006.01) |

(52) U.S. Cl.
CPC .......... *H01S 3/136* (2013.01); *G03F 7/70025* (2013.01); *H01S 3/08009* (2013.01); *H01S 3/1305* (2013.01)

(58) Field of Classification Search
CPC .... H01S 3/136; H01S 3/08009; H01S 3/1305; H01S 3/0812; H01S 3/0826; H01S 3/225; H01S 3/0809; H01S 3/139; G03F 7/70025; G03F 7/20

See application file for complete search history.

(56) References Cited

U.S. PATENT DOCUMENTS

| 7,154,928 B2 | 12/2006 | Sandstrom et al. |
| 2002/0154661 A1 | 10/2002 | Hoose et al. |
| 2005/0286598 A1 | 12/2005 | Sandstrom et al. |

(Continued)

FOREIGN PATENT DOCUMENTS

| JP | S51-31195 A | 3/1976 |
| JP | 2006-269628 A | 10/2006 |

(Continued)

OTHER PUBLICATIONS

International Search Report issued in PCT/JP2020/012547; mailed Jun. 30, 2020.

(Continued)

*Primary Examiner* — Mesfin T Asfaw
(74) *Attorney, Agent, or Firm* — Studebaker & Brackett PC

(57) ABSTRACT

A narrowed-line gas laser apparatus includes a laser chamber that accommodates a pair of electrodes disposed so as to face each other, an output coupling mirror, and a line narrowing apparatus that forms an optical resonator along with the output coupling mirror, the line narrowing apparatus including an optical system having a first region and a second region on which a first portion and a second portion of a light beam that exits out of the laser chamber are incident, the first and second portions passing through different positions in a direction in which the pair of electrodes face each other, the optical system being configured to suppress an increase in the distance between the optical path axis of the first portion and the optical path axis of the second portion.

20 Claims, 9 Drawing Sheets

(56) References Cited

U.S. PATENT DOCUMENTS

2006/0239324 A1  10/2006  Akagawa et al.
2017/0205631 A1   7/2017  Watabe et al.
2018/0041000 A1   2/2018  Miyamoto

FOREIGN PATENT DOCUMENTS

| JP | 2007-005538 A | 1/2007 |
| JP | 2008-504684 A | 2/2008 |
| WO | 2016/076279 A1 | 5/2016 |
| WO | 2016/189968 A1 | 12/2016 |

OTHER PUBLICATIONS

International Preliminary Report On Patentability and Written Opinion issued in PCT/JP2020/012547; issued Sep. 20, 2022.

NARROWED-LINE GAS LASER APPARATUS AND METHOD FOR MANUFACTURING ELECTRONIC DEVICES

CROSS-REFERENCE TO RELATED APPLICATIONS

The present application is a continuation application of International Application No. PCT/JP2020/012547, filed on Mar. 19, 2020, the entire contents of which are hereby incorporated by reference.

BACKGROUND

1. Technical Field

The present disclosure relates to a narrowed-line gas laser apparatus and a method for manufacturing electronic devices.

2. Related Art

In recent years, a semiconductor exposure apparatus is required to improve the resolution thereof as semiconductor integrated circuits are increasingly miniaturized and highly integrated. To this end, reduction in the wavelength of light outputted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

The light from spontaneously oscillating KrF and ArF excimer laser apparatuses has a wide spectral linewidth ranging from 350 to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light outputted from the gas laser apparatus needs to be narrow enough to make the chromatic aberrations negligible. To this end, a line narrowing module (LNM) including a line narrowing element (such as etalon and grating) is provided in some cases in a laser resonator of the gas laser apparatus to narrow the spectral linewidth. A gas laser apparatus providing a narrowed spectral linewidth is hereinafter referred to as a narrowed-line gas laser apparatus.

CITATION LIST

Patent Literature

[PTL 1] JP-A-51-031195
[PTL 2] U.S. Pat. No. 7,154,928
[PTL 3] U.S. Patent application Publication No. 2006/239324

SUMMARY

A narrowed-line gas laser apparatus according to a viewpoint of the present disclosure includes a laser chamber accommodating a pair of electrodes disposed so as to face each other, an output coupling mirror, and a line narrowing apparatus forming an optical resonator along with the output coupling mirror, the line narrowing apparatus including an optical system having a first region and a second region on which a first portion and a second portion of a light beam that exits out of the laser chamber are incident, the first and second portions passing through different positions in a direction in which the pair of electrodes face each other, the optical system being configured to suppress an increase in a distance between an optical path axis of the first portion and an optical path axis of the second portion.

A narrowed-line gas laser apparatus according to another viewpoint of the present disclosure includes a laser chamber accommodating a pair of electrodes disposed so as to face each other, an output coupling mirror, and a line narrowing apparatus including a first grating and forming an optical resonator along with the output coupling mirror, the line narrowing apparatus including an optical system having a first region and a second region on which a first portion and a second portion of a light beam that exits out of the laser chamber are incident, the first and second portions passing through different positions in a direction of grooves of the first grating, the optical system being configured to suppress an increase in a distance between an optical path axis of the first portion and an optical path axis of the second portion.

A method for manufacturing electronic devices according to a viewpoint of the present disclosure includes causing a narrowed-line gas laser apparatus to produce pulsed laser light, the narrowed-line gas laser apparatus including a laser chamber accommodating a pair of electrodes disposed so as to face each other, an output coupling mirror, and a line narrowing apparatus forming an optical resonator along with the output coupling mirror, the line narrowing apparatus including an optical system having a first region and a second region on which a first portion and a second portion of a light beam that exits out of the laser chamber are incident, the first and second portions passing through different positions in a direction in which the pair of electrodes face each other, the optical system being configured to suppress an increase in a distance between an optical path axis of the first portion and an optical path axis of the second portion, outputting the pulsed laser light to an exposure apparatus, and exposing a light sensitive substrate with the pulsed laser light in the exposure apparatus to manufacture the electronic devices.

BRIEF DESCRIPTION OF THE DRAWINGS

Embodiments of the present disclosure will be described below only by way of example with reference to the accompanying drawings.

DETAILED DESCRIPTION

Figure 1:
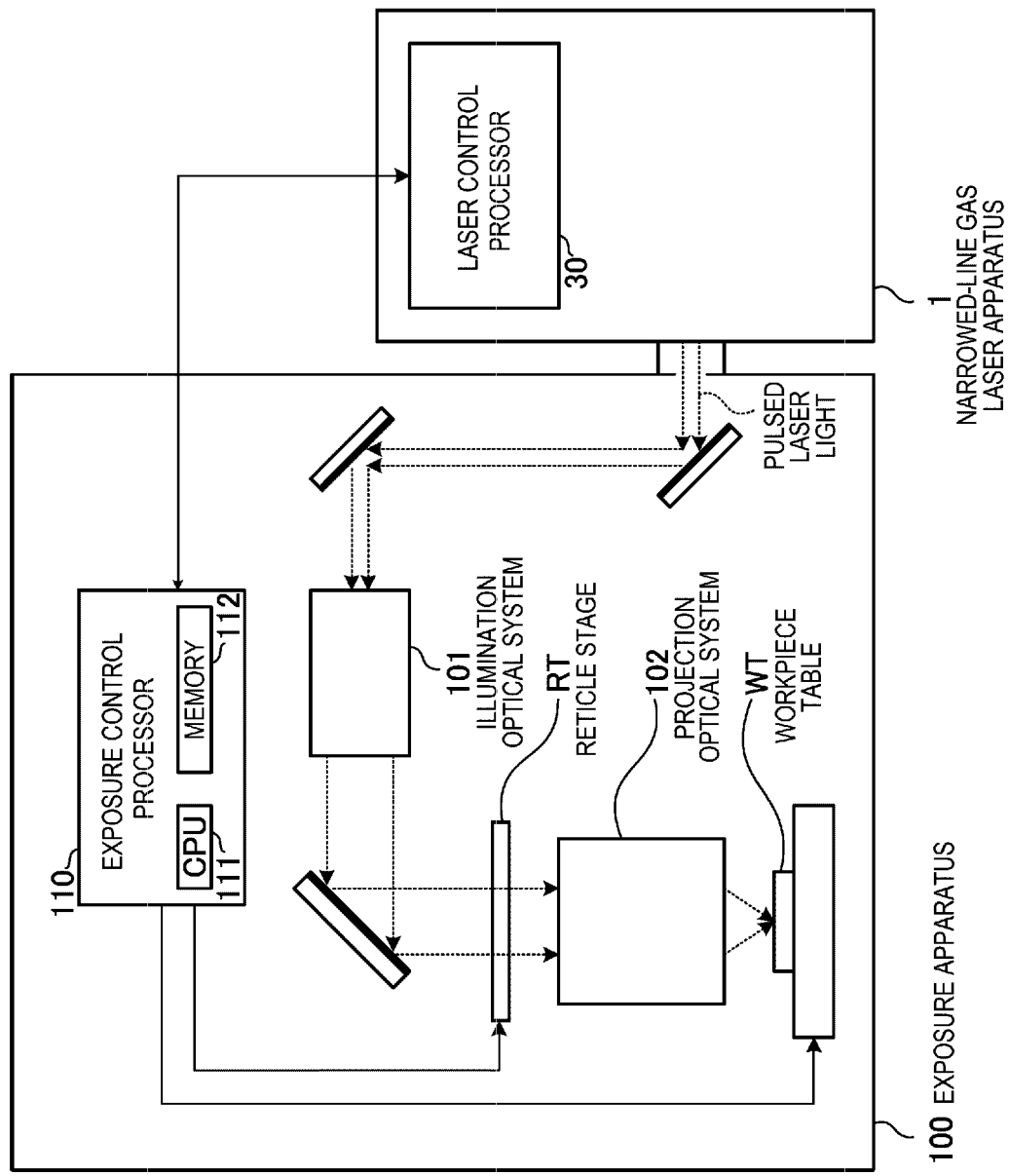
FIG. 1 schematically shows the configuration of an exposure system according to Comparative Example.

<Contents>
1. Comparative Example
  1.1 Exposure system
    1.1.1 Configuration of exposure apparatus 100
    1.1.2 Operation
  1.2 Narrowed-line gas laser apparatus
    1.2.1 Configuration
      1.2.1.1 Master oscillator MO
      1.2.1.2 Laser control processor 30
      1.2.1.3 Gas regulator GA
    1.2.2 Operation
      1.2.2.1 Laser control processor 30
      1.2.2.2 Master oscillator MO
      1.2.2.3 Gas regulator GA
  1.3 Line narrowing apparatus
    1.3.1 Configuration
      1.3.1.1 Prisms 40 and 43
      1.3.1.2 Gratings 51 and 52
    1.3.2 Operation
    1.3.3 Problems with Comparative Example
2. Narrowed-line gas laser apparatus including two tilted gratings
  2.1 Configuration
  2.2 Operation
  2.3 Effects
  2.4 Variation
  2.5 Other configuration examples
3. Narrowed-line gas laser apparatus including two tilted prisms
  3.1 Configuration
  3.2 Operation
  3.3 Effects
  3.4 Other configuration examples
4. Narrowed-line gas laser apparatus including one tilted prism and one tilted grating
  4.1 Configuration
  4.2 Operation
  4.3 Effects
  4.4 Other configuration examples
5. Narrowed-line gas laser apparatus including two tilted mirrors
  5.1 Configuration
  5.2 Operation
  5.3 Effects
  5.4 Other configuration examples
6. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Comparative Example

1.1 Exposure System

Figure 2:
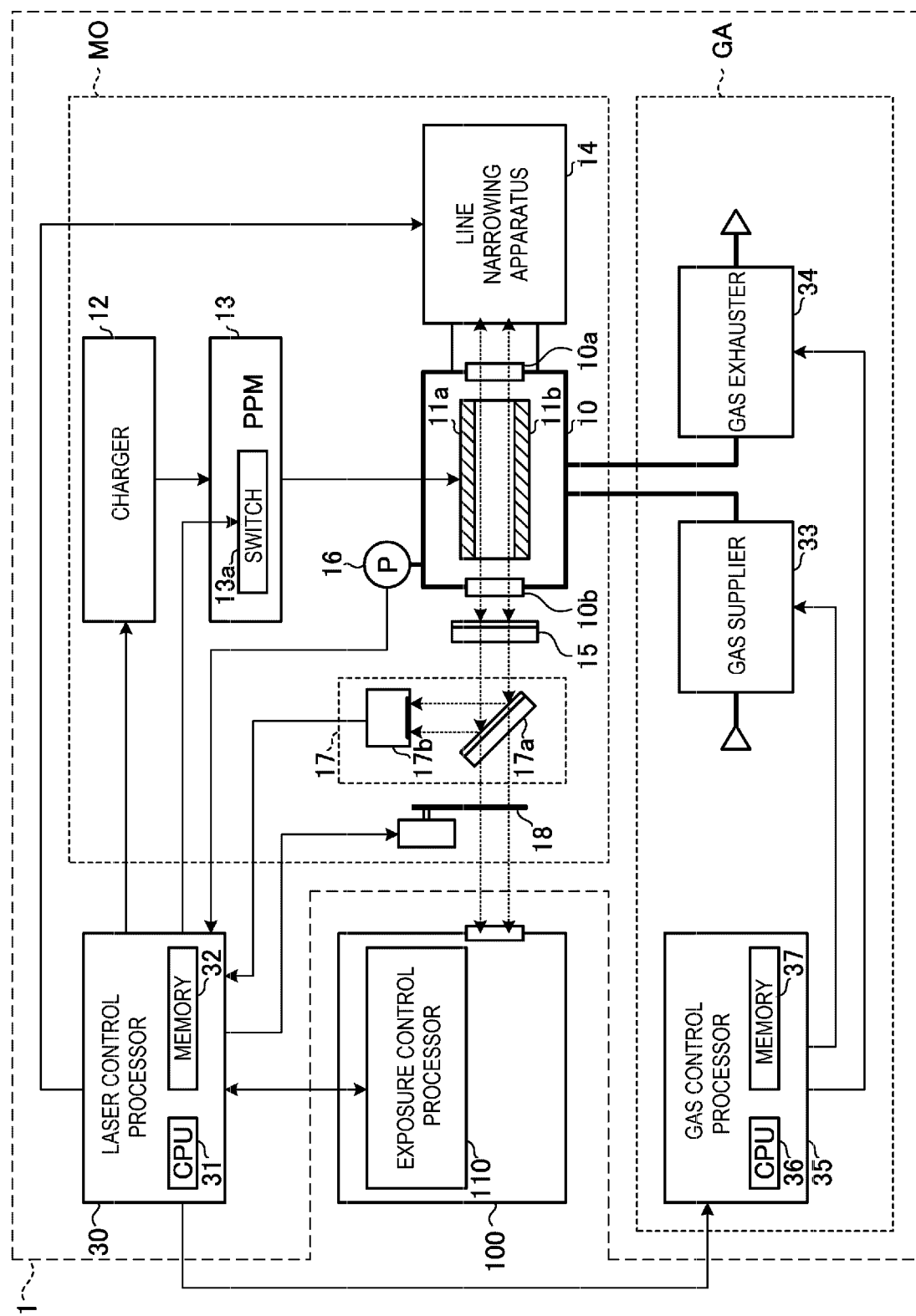
FIG. 2 schematically shows the configuration of the exposure system according to Comparative Example.

FIGS. 1 and 2 schematically show the configuration of an exposure system according to Comparative Example. Comparative Example in the present disclosure is an aspect that the applicant is aware is known only by the applicant, and is not a publicly known example that the applicant is self-aware of.

The exposure system includes a narrowed-line gas laser apparatus 1 and an exposure apparatus 100. FIG. 1 shows the narrowed-line gas laser apparatus 1 in a simplified form. FIG. 2 shows the exposure apparatus 100 in a simplified form.

The narrowed-line gas laser apparatus 1 includes a laser control processor 30. The narrowed-line gas laser apparatus 1 is configured to output pulsed laser light toward the exposure apparatus 100.

1.1.1 Configuration of Exposure Apparatus 100

The exposure apparatus 100 includes an illumination optical system 101, a projection optical system 102, and an exposure control processor 110, as shown in FIG. 1.

The illumination optical system 101 illuminates a reticle pattern of a reticle that is not shown but is placed on a reticle stage RT with the pulsed laser light having entered the exposure apparatus 100 from the narrowed-line gas laser apparatus 1.

The projection optical system 102 performs reduction projection on the pulsed laser light having passed through the reticle to bring the pulsed laser light into focus on a workpiece that is not shown but is placed on a workpiece table WT. The workpiece is a light sensitive substrate, such as a semiconductor wafer onto which a photoresist has been applied in the form of a film.

The exposure control processor 110 is a processing apparatus including a memory 112, which stores a control program, and a CPU (central processing unit) 111, which executes the control program. The exposure control processor 110 is particularly configured or programmed to carry out a variety of processes contained in the present disclosure. The exposure control processor 110 oversees and controls the exposure apparatus 100 and transmits and receives a variety of data and signals to and from the laser control processor 30.

1.1.2 Operation

The exposure control processor 110 transmits data on a wavelength target value, data on a target pulse energy value, and a trigger signal to the laser control processor 30. The laser control processor 30 controls the narrowed-line gas laser apparatus 1 in accordance with the data and the signal.

The exposure control processor 110 translates the reticle stage RT and the workpiece table WT in opposite directions in synchronization with each other. The workpiece is thus exposed to the pulsed laser light having reflected the reticle pattern.

The exposure step described above causes the reticle pattern to be transferred to the semiconductor wafer. The following multiple steps allow manufacture of electronic devices.

1.2 Narrowed-Line Gas Laser Apparatus

1.2.1 Configuration

The narrowed-line gas laser apparatus 1 includes a master oscillator MO and a gas regulator GA as well as the laser control processor 30, as shown in FIG. 2.

1.2.1.1 Master Oscillator MO

The master oscillator MO includes a laser chamber 10, a charger 12, a pulse power module (PPM) 13, a line narrowing apparatus 14, an output coupling mirror 15, a photodetector 17, and a shutter 18. The line narrowing apparatus 14 and the output coupling mirror 15 form an optical resonator.

The laser chamber 10 is disposed in the optical path of the optical resonator. The laser chamber 10 is provided with windows 10a and 10b.

The laser chamber 10 has a pair of electrodes 11a and 11b provided therein and disposed so as to face each other, and further houses a laser gas as a laser medium. The laser medium is, for example, $F_2$, ArF, KrF, XeCl, or XeF.

A pressure sensor 16 is attached to the laser chamber 10.

The charger 12 retains electrical energy to be supplied to the pulse power module 13. The pulse power module 13 includes a switch 13a.

The line narrowing apparatus 14 includes wavelength selectors such as prisms 40 and 43 and gratings 51 and 52, which will be described later.

The output coupling mirror 15 is formed of a partial reflection mirror.

The photodetector 17 includes a beam splitter 17a and a sensor unit 17b. The beam splitter 17a is disposed in the optical path of the pulsed laser light outputted via the output coupling mirror 15. The beam splitter 17a is configured to transmit a portion of the pulsed laser light at high transmittance and reflect the other portion of the pulsed laser light to cause the reflected light to enter the sensor unit 17b. The sensor unit 17b includes a spectral sensor and is capable of outputting data on a measured wavelength. The sensor unit 17b further includes an energy sensor and is capable of outputting data on measured pulse energy.

The shutter 18 is disposed in the optical path of the pulsed laser light having passed through the beam splitter 17a. When the shutter 18 is closed, the pulsed laser light having passed through the beam splitter 17a is blocked so as not to enter the exposure apparatus 100. When the shutter 18 is open, the pulsed laser light having passed through the beam splitter 17a is not blocked but enters the exposure apparatus 100.

1.2.1.2 Laser Control Processor 30

The laser control processor 30 is a processing apparatus including a memory 32, which stores a control program, and a CPU 31, which executes the control program. The laser control processor 30 is particularly configured or programmed to carry out a variety of processes contained in the present disclosure.

1.2.1.3 Gas Regulator GA

The gas regulator GA includes a gas supplier 33, a gas exhauster 34, and a gas control processor 35.

The gas supplier 33 includes a valve that is not shown but is provided in a first pipe between the laser chamber 10 and a gas cylinder that is not shown.

The gas exhauster 34 includes a valve, a pump, and a detoxifier that are not shown but are provided in a second pipe connected to the laser chamber 10.

The gas control processor 35 is a processing apparatus including a memory 37, which stores a control program, and a CPU 36, which executes the control program. The gas control processor 35 is particularly configured or programmed to carry out a variety of processes contained in the present disclosure.

1.2.2 Operation

1.2.2.1 Laser Control Processor 30

The laser control processor 30 acquires the data on a wavelength target value from the exposure control processor 110. The laser control processor 30 transmits an initial setting signal to the line narrowing apparatus 14 based on the wavelength target value. After the narrowed-line gas laser apparatus 1 starts outputting the pulsed laser light, the laser control processor 30 receives the data on a measured wavelength from the photodetector 17 and transmits a feedback control signal to the line narrowing apparatus 14 based on the wavelength target value and the data on a measured wavelength.

The laser control processor 30 acquires the data on a pulse energy target value from the exposure control processor 110. The laser control processor 30 transmits an initial setting signal that sets a charge voltage HV to the charger 12 based on the pulse energy target value. After the narrowed-line gas laser apparatus 1 starts outputting the pulsed laser light, the laser control processor 30 receives the data on measured pulse energy from the photodetector 17 and transmits a feedback control signal that performs feedback control on the charge voltage HV to the charger 12 based on the pulse energy target value and the data on measured pulse energy.

The laser control processor 30 receives the trigger signal from the exposure control processor 110. The laser control processor 30 transmits an oscillation trigger signal based on the trigger signal to the switch 13a of the pulse power module 13.

The laser control processor 30 transmits a gas control signal to the gas control processor 35. Furthermore, the laser control processor 30 receives data on a gas pressure P measured by the pressure sensor 16 and transmits the data on the measured gas pressure P to the gas control processor 35.

1.2.2.2 Master Oscillator MO

The switch 13a is turned on upon receipt of the oscillation trigger signal from the laser control processor 30. The pulse power module 13 generates a pulsed high voltage from the electric energy held in the charger 12 when the switch 13a is turned on. The pulse power module 13 applies the high voltage to the space between the electrodes 11a and 11b.

When the high voltage is applied to the space between the electrodes 11a and 11b, discharge occurs between the electrodes 11a and 11b. The energy of the discharge excites the laser gas in the laser chamber 10, and the excited laser gas transitions to a high energy level. Thereafter, when the excited laser gas transitions to a low energy level, the laser gas emits light having a wavelength according to the difference between the energy levels.

The light generated in the laser chamber 10 exits out of the laser chamber 10 via the windows 10a and 10b. The light having exited via the window 10a enters the line narrowing apparatus 14 as a light beam. Light having a desired wavelength and therearound out of the light that enters the line narrowing apparatus 14 is deflected back by the line narrowing apparatus 14 and returns to the laser chamber 10.

The output coupling mirror 15 transmits and outputs part of the light having exited via the window 10b and reflects the remaining light back into the laser chamber 10.

The light having exited out of the laser chamber 10 thus travels back and forth between the line narrowing apparatus 14 and the output coupling mirror 15. The light is amplified whenever passing through the discharge space between the pair of electrodes 11a and 11b. The light thus having undergone the laser oscillation and the line narrowing operation is outputted as the pulsed laser light via the output coupling mirror 15.

The pulsed laser light outputted from the narrowed-line gas laser apparatus 1 enters the exposure apparatus 100.

1.2.2.3 Gas Regulator GA

The gas control processor 35 controls the gas supplier 33 and the gas exhauster 34 in such a way that the gas pressure P in the laser chamber 10 has a desired value based on the gas control signal received from the laser control processor 30 and the data on the measured gas pressure P.

For example, to raise the gas pressure P in the laser chamber 10, the gas control processor 35 opens the valve provided in the gas supplier 33 in such a way that the laser gas is supplied to the interior of the laser chamber 10. For example, to lower the gas pressure P in the laser chamber 10, the gas control processor 35 opens the valve provided in the gas exhauster 34 in such a way that part of the laser gas in the laser chamber 10 is exhausted.

1.3 Line Narrowing Apparatus

1.3.1 Configuration

Figure 3A:
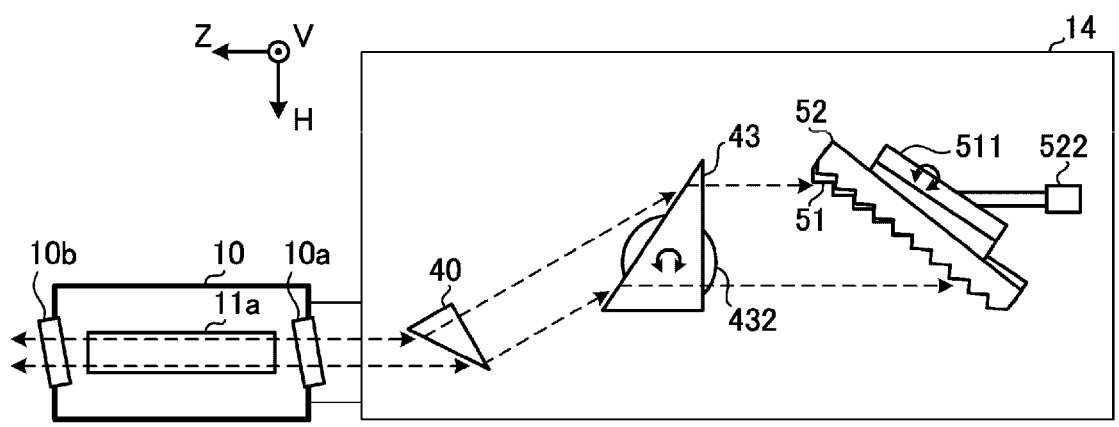
FIGS. 3A and 3B schematically show the configuration of a line narrowing apparatus in Comparative Example.
Figure 3B:
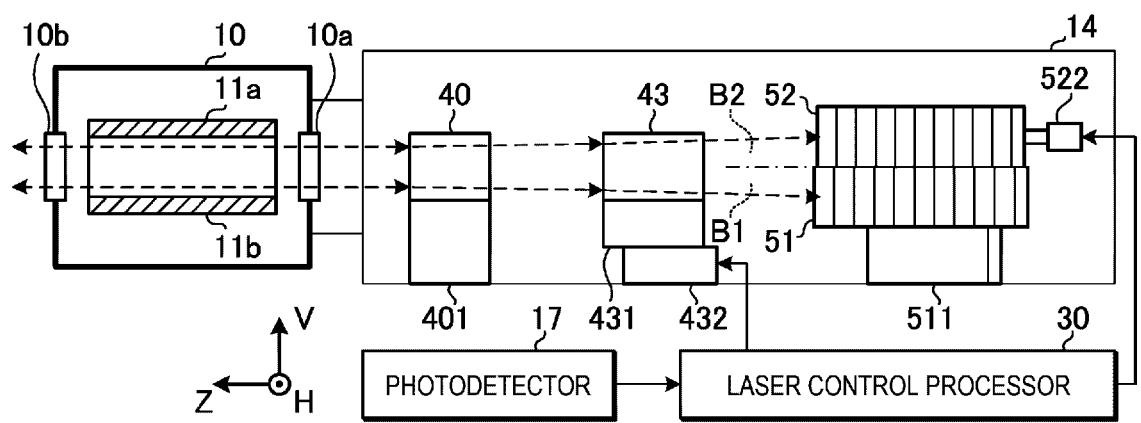

FIGS. 3A and 3B schematically show the configuration of the line narrowing apparatus 14 in Comparative Example. FIGS. 3A and 3B further show the configuration of another portion of the narrowed-line gas laser apparatus 1. V, H, and Z axes, which are perpendicular to one another, are shown in FIGS. 3A and 3B. FIG. 3A shows the line narrowing apparatus 14 viewed in the direction −V, and FIG. 3B shows the line narrowing apparatus 14 viewed in the direction −H. The directions −V and +V coincide with the direction in which the electrodes 11a and 11b face each other. The direction −Z coincides with the traveling direction of the light beam having exited via the window 10a. The direction +Z coincides with the traveling direction of the pulsed laser light having exited via the window 10b and outputted via the output coupling mirror 15.

The line narrowing apparatus 14 includes the prisms 40 and 43 and the gratings 51 and 52.

1.3.1.1 Prisms 40 and 43

The prism 40 is disposed in the optical path of the light beam having exited via the window 10a. The prism 40 is supported by a holder 401.

The prism 43 is disposed in the optical path of the light beam having passed through the prism 40. The prism 43 is supported by a holder 431.

The prisms 40 and 43 are made of a material having high transmittance for the wavelength selected by the line narrowing apparatus 14, such as calcium fluoride or synthetic quartz.

The prisms 40 and 43 are each so disposed that the surface thereof on which the light beam is incident and the surface thereof via which the light beam exits are both parallel to the axis V. The prism 43 is rotatable around an axis parallel to the axis V with the aid of a rotation mechanism 432.

1.3.1.2 Gratings 51 and 52

The gratings 51 and 52 are disposed in the optical path of the light beam having passed through the prism 43 in positions different from each other in the direction of the axis V. The direction of the grooves of each of the gratings 51 and 52 coincides with the direction of the axis V. The positions of the gratings 51 and 52 are so set that the light beam having passed through the prism 43 is incident across the gratings 51 and 52. Out of the light beam having passed through the prism 43, it is assumed that the portion incident on the grating 51 is a first portion B1, and that the portion incident on the grating 52 is a second portion B2.

The gratings 51 and 52 are supported by a holder 511. It is noted that the grating 51 is supported so as to maintain a fixed posture, whereas the grating 52 is rotatable around an axis parallel to the axis V with the aid of a rotation mechanism 522.

1.3.2 Operation

The light beam having exited via the window 10a is redirected by each of the prisms 40 and 43 in a plane parallel to the plane HZ, which is a plane perpendicular to the axis V, and the width of the light beam is increased by the two prisms in the plane parallel to the plane HZ. The traveling direction of the light beam passing through both the prisms 40 and 43 and traveling toward the gratings 51 and 52 substantially coincides with the direction −Z by way of example.

The light incident from the prism 43 on the gratings 51 and 52 is reflected off and diffracted by a plurality of grooves of each of the gratings 51 and 52 in the direction according to the wavelength of the light. The light reflected off the plurality of grooves of each of the gratings 51 and 52 is thus dispersed in the plane parallel to the plane HZ. The grating 51 is disposed in the Littrow arrangement, which causes the angle of incidence of the first portion B1 of the light beam incident from the prism 43 on the grating 51 to be equal to the angle of diffraction of the diffracted light having a desired first wavelength $\lambda 1$. The grating 52 is disposed in the Littrow arrangement, which causes the angle of incidence of the second portion B2 of the light beam incident from the prism 43 on the grating 52 to be equal to the angle of diffraction of the diffracted light having a desired second wavelength $\lambda 2$. When the angles of incidence of the first portion B1 incident on the grating 51 and the second portion B2 incident on the grating 52 differ from each other, a wavelength difference occurs between the first wavelength $\lambda 1$ of the diffracted light that returns from the grating 51 back to the prism 43 and the second wavelength $\lambda 2$ of the diffracted light that returns from the grating 52 back to the prism 43.

In FIGS. 3A and 3B, the broken-line arrows representing the light beam having exited via the window 10a only indicate the direction from the window 10a toward the gratings 51 and 52, whereas the light beam having the wavelength selected by the line narrowing apparatus 14 travels from the gratings 51 and 52 toward the window 10a in the path in the direction opposite the broken-line arrows.

The prisms 43 and 40 reduce the beam width of the light having returned from the gratings 51 and 52 in the plane parallel to the plane HZ, and cause the resultant light to return into the laser chamber 10 via the window 10a.

The rotation mechanisms 432 and 522 are controlled by the laser control processor 30.

When the rotation mechanism 432 slightly rotates the prism 43, the traveling direction of the light beam that exits out of the prism 43 toward the gratings 51 and 52 slightly changes in the plane parallel to the plane HZ. The angle of incidence of the first portion B1 of the light beam incident on the grating 51 and the angle of incidence of the second portion B2 of the light beam incident on the grating 52 therefore slightly change. The first wavelength $\lambda 1$ and the second wavelength $\lambda 2$ therefore both change.

When the rotation mechanism 522 slightly rotates the grating 52, the angle of incidence of the first portion B1 of the light beam incident on the grating 51 does not change, but the angle of incidence of the second portion B2 of the light beam incident on the grating 52 slightly changes. The difference between the first wavelength $\lambda 1$ and the second wavelength $\lambda 2$ therefore changes.

The exposure control processor 110 (see FIG. 2) transmits a target value $\lambda 1t$ of the first wavelength $\lambda 1$ and a target value $\lambda 2t$ of the second wavelength $\lambda 2$ to the laser control processor 30. The photodetector 17 outputs data on measured first wavelength $\lambda 1$ and second wavelength $\lambda 2$ to the laser control processor 30.

Based on the target value $\lambda 1t$ of the first wavelength $\lambda 1$ and the data on the measured first wavelength $\lambda 1$, the laser control processor 30 controls the rotation mechanism 432 in such a way that the first wavelength $\lambda 1$ approaches the target value $\lambda 1t$. The rotation mechanism 432 thus changes the posture of the prism 43 to adjust the angle of incidence of the first portion B1 incident on the grating 51 and the angle of incidence of the second portion B2 incident on the grating 52.

Based on the target value $\lambda 2t$ of the second wavelength $\lambda 2$ and the data on the measured second wavelength $\lambda 2$, the laser control processor 30 controls the rotation mechanism 522 in such a way that the second wavelength $\lambda 2$ approaches the target value $\lambda 2t$. The rotation mechanism 522 thus changes the posture of the grating 52 to adjust the angle of incidence of the second portion B2 incident on the grating 52.

The configurations and operations described above select the first wavelength $\lambda 1$ contained in the first portion B1 and the second wavelength $\lambda 2$ contained in the second portion B2 out of the light beam having exited via the window 10a of the laser chamber 10 to perform line narrowing on the light beam, and the line-narrowed light returns into the laser chamber 10. The narrowed-line gas laser apparatus 1 can thus perform two-wavelength oscillation. Controlling the rotation mechanisms 432 and 522 also allows the first wavelength $\lambda 1$ and the second wavelength $\lambda 2$ to be separately set.

The focal length in the exposure apparatus 100 (see FIG. 1) depends on the wavelength of the pulsed laser light. The pulsed laser light outputted from the narrowed-line gas laser apparatus 1 performing the two-wavelength oscillation can be brought into focus in two different positions in the direction of the optical path axis of the pulsed laser light at the workpiece table WT of the exposure apparatus 100, whereby the depth of focus can be substantially increased.

For example, even when a resist film having a large thickness is exposed to the pulsed laser light, variation in the imaging performance can be suppressed in the thickness direction of the resist film.

1.3.3 Problems with Comparative Example

When two gratings 51 and 52 are used for the two-wavelength oscillation, the pulse energy of the pulsed laser light is lower in some cases than in a case where a single grating is used.

Figure 4A:
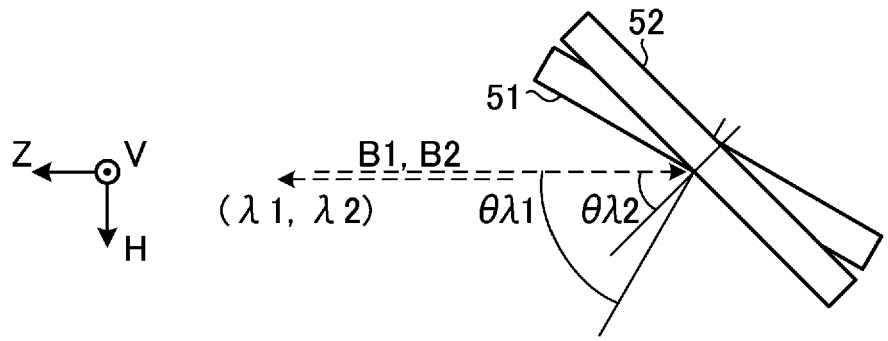
FIGS. 4A to 4D diagrammatically show the relationship of gratings with an optical path axis of a light beam in Comparative Example.
Figure 4B:
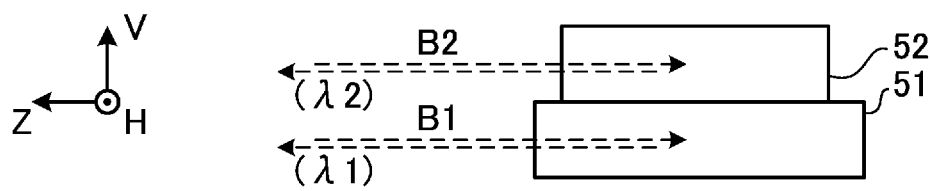
Figure 4C:
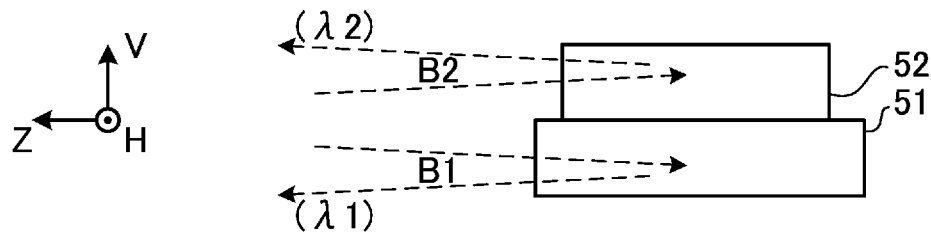
Figure 4D:
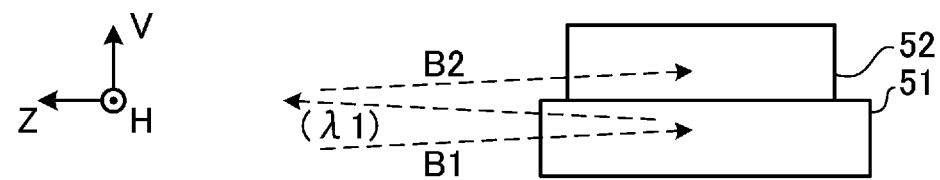

FIGS. 4A to 4D diagrammatically show the relationship of the gratings 51 and 52 with the optical path axis of the light beam in Comparative Example. FIG. 4A shows the gratings 51 and 52 viewed in the direction $-V$, and FIGS. 4B to 4D show the gratings 51 and 52 viewed in the direction $-H$. FIGS. 4A to 4D do not show the grooves of the gratings 51 and 52.

FIGS. 4A and 4B illustrate ideal positions and directions of the optical path axes of the first portion B1 and the second portion B2 of the light beam incident on the gratings 51 and 52. The optical path axis refers to the center axis of the optical path. Out of the light beam having passed through the prism 43, the first portion B1 is incident on the grating 51, and the second portion B2 is incident on the grating 52. The postures of the gratings 51 and 52 are so set that the angle of incidence of the first portion B1 incident on the grating 51 is $\theta\lambda 1$ and the angle of incidence of the second portion B2 incident on the grating 52 is $\theta\lambda 2$.

Out of the first portion B1 incident on the grating 51, the light having the first wavelength $\lambda 1$ is diffracted at an angle of diffraction $\theta\lambda 1$ equal to the angle of incidence $\theta\lambda 1$ and caused to return to the prism 43. Out of the second portion B2 incident on the grating 52, the light having the second wavelength $\lambda 2$ is diffracted at an angle of diffraction $\theta\lambda 2$ equal to the angle of incidence $\theta\lambda 2$ and caused to return to the prism 43.

When the output coupling mirror 15 repeatedly deflects the light caused to return from the grating 51 to the prism 43 and having the first wavelength $\lambda 1$ back onto the grating 51 again, the light having the first wavelength $\lambda 1$ is amplified. When the output coupling mirror 15 repeatedly deflects the light caused to return from the grating 52 to the prism 43 and having the second wavelength $\lambda 2$ back onto the grating 52 again, the light having the second wavelength $\lambda 2$ is amplified.

However, the light beam containing the first portion B1 and the second portion B2 is incident on the gratings 51 and 52 while spreading in the direction of the axis V in some cases, as shown in FIG. 4C. When the gratings 51 and 52 diffract the light beam with the angle of divergence thereof maintained in the direction of the axis V, the light beam spreads by too large amount in the direction of the axis V, and part of the light beam cannot return to the prism 43 in some cases. Part of the energy of the amplified light beam may therefore be wasted.

Furthermore, when the output coupling mirror 15 deflects back the light caused to return from the grating 51 to the prism 43 and having the first wavelength $\lambda 1$, part of the light having the first wavelength $\lambda 1$ may be incident on the grating 52 as the second portion B2, as shown in FIG. 4D. The light having the first wavelength $\lambda 1$ is not diffracted by the grating 52 at the angle of diffraction $\theta\lambda 2$ and cannot therefore return to the prism 43 in some cases. The light having the second wavelength $\lambda 2$, which is not shown in FIG. 4D, also cannot return to the prism 43 in some cases when deflected back by the output coupling mirror 15 and incident on the grating 51. Part of the energy of the amplified light beam may therefore be wasted.

In some embodiments described below, the line narrowing apparatus is configured to suppress an increase in the distance between the optical path axis of the first portion B1 and the optical path axis of the second portion B2. For example, at least one of the gratings 51 and 52 is so tilted that planes thereof perpendicular to the direction of the grooves of the gratings 51 and 52 intersect with each other at a position facing the front side of the gratings 51 and 52. Instead, tilted prisms or mirrors are disposed. In some embodiments, the tilt angles of such optical elements are adjusted based on data on the pulse energy measured by the photodetector 17.

2. Narrowed-Line Gas Laser Apparatus Including Two Tilted Gratings

2.1 Configuration

Figure 5A:
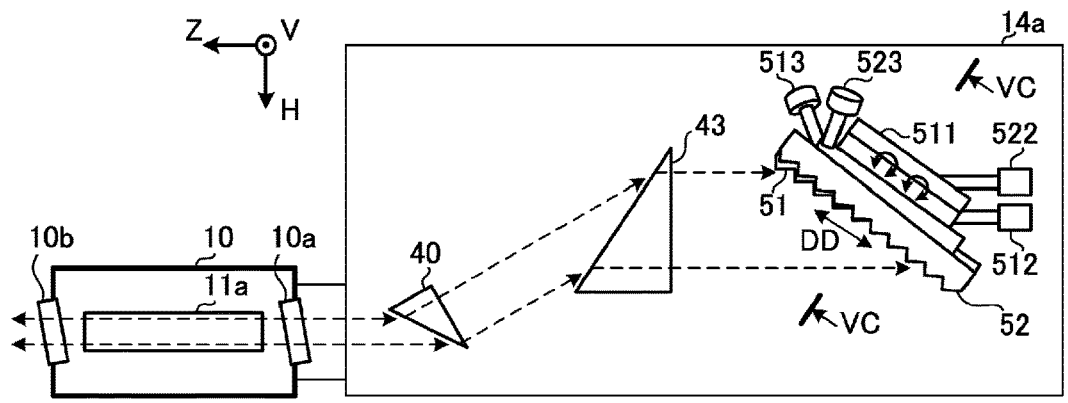
FIGS. 5A and 5B schematically show the configuration of a line narrowing apparatus in a first embodiment.
Figure 5B:
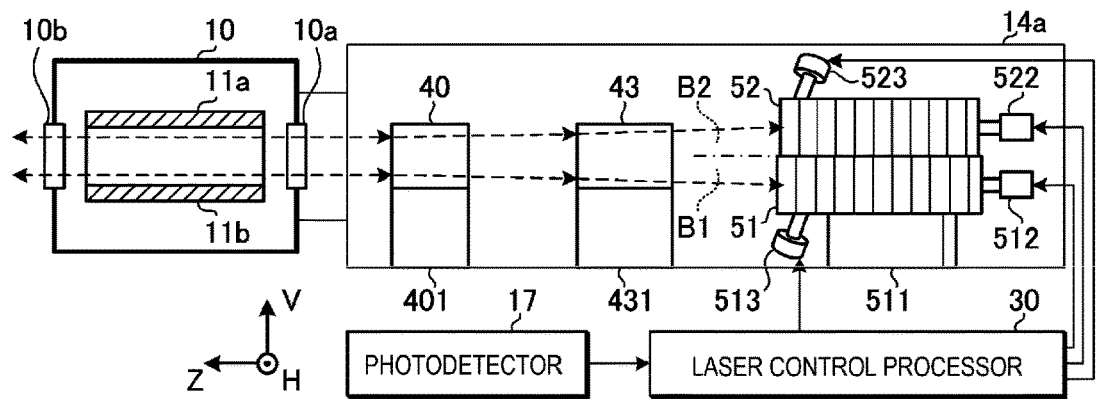

FIGS. 5A and 5B schematically show the configuration of a line narrowing apparatus 14a in the first embodiment. FIGS. 5A and 5B further show the configuration of another portion of the narrowed-line gas laser apparatus 1. FIG. 5A shows the line narrowing apparatus 14a viewed in the direction −V, and FIG. 5B shows the line narrowing apparatus 14a viewed in the direction −H.

The line narrowing apparatus 14a includes a rotation mechanism 512 and tilt adjustment mechanisms 513 and 523.

Figure 5C:
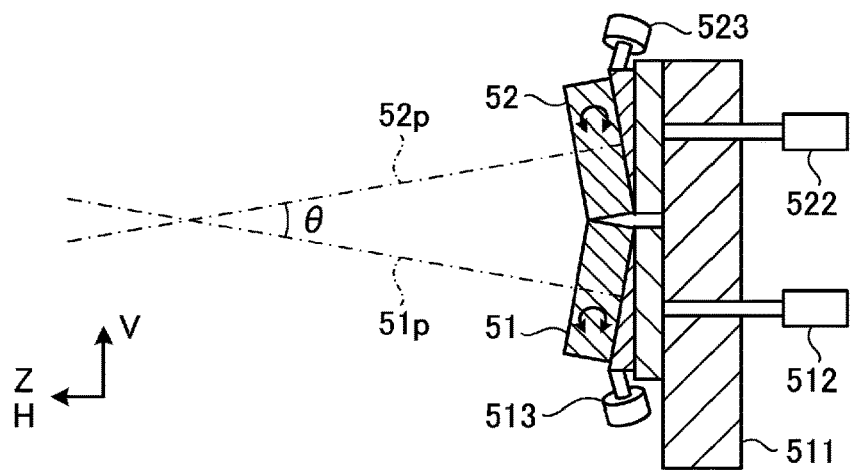
FIG. 5C is a cross-sectional view of the line narrowing apparatus taken along the line VC-VC in FIG. 5A.

FIG. 5C is a cross-sectional view of the line narrowing apparatus 14a taken along the line VC-VC in FIG. 5A. A plane passing through part of the grating 51 and perpendicular to the direction of the grooves of the grating 51 is called a plane 51p. A plane passing through part of the grating 52 and perpendicular to the direction of the grooves of the grating 52 is called a plane 52p. The grating 51 is so disposed that the plane 51p slightly inclines with respect to the plane HZ. The grating 52 is so disposed that the plane 52p slightly inclines with respect to the plane HZ. The planes 51p and 52p intersect with each other at a position facing the front side of the gratings 51 and 52. The front side of the gratings 51 and 52 corresponds to the left side in FIG. 5C, that is, the light beam incident side. The angle between the planes 51p and 52p is called a grating angular difference $\theta$. In FIG. 5C, the angular difference $\theta$ is drawn in a greatly exaggerated manner.

Figure 6:
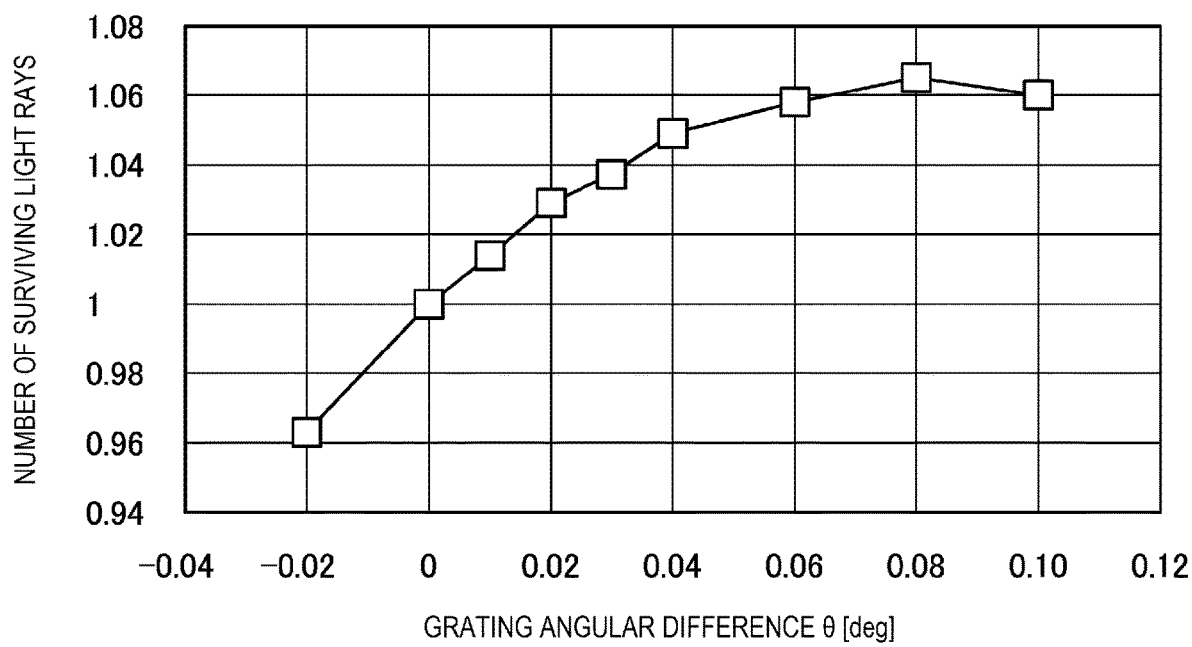
FIG. 6 is a graph showing a result of a simulation of the relationship between a grating angular difference θ and the number of surviving light rays in an optical resonator.

FIG. 6 is a graph showing a result of a simulation of the relationship between the grating angular difference $\theta$ and the number of surviving light rays in the optical resonator. The definition of the number of surviving light rays in the optical resonator is as follows: Provided that a large number of light rays are generated in random positions and directions in the optical resonator, the number of surviving light rays is the number of light rays that remain in the optical resonator after the light rays reciprocate a predetermined number of times in the optical resonator. In FIG. 6, the predetermined number of times of reciprocation is set at four. The values along the vertical axis of FIG. 6 are relative values obtained by division of the number of surviving light rays by those in a case where the grating angular difference $\theta$ is zero. Negative grating angular differences $\theta$ along the horizontal axis of FIG. 6 correspond to a case where the planes 51p and 52p intersect with each other at a position facing the rear side of the gratings 51 and 52, that is, on the right side in FIG. 5C.

FIG. 6 shows that the number of surviving light rays in the case where the grating angular difference $\theta$ is negative is smaller than in the case where the grating angular difference $\theta$ is zero, and that the number of surviving light rays in the case where the grating angular difference $\theta$ is positive is greater than in the case where the grating angular difference $\theta$ is zero. FIG. 6 further shows that the number of surviving light rays peaks when the grating angular difference $\theta$ is 0.08 degrees, and that the number of surviving light rays tends to decrease as the grating angular difference $\theta$ further increases. FIG. 6 still further shows that the grating angular difference $\theta$ is desirably greater than or equal to 0.06 degrees but smaller than or equal to 0.1 degrees.

The description will be resumed with reference to FIGS. 5A to 5C again.

The grating 51 in Comparative Example is supported so as to maintain a fixed posture, whereas the grating 51 in the first embodiment is rotatable around an axis parallel to the axis V with the aid of the rotation mechanism 512.

The rotation mechanism 432 (see FIGS. 3A and 3B), which rotates the prism 43, may not be provided in the first embodiment. That is, the posture of the prism 43 may be maintained fixed.

The tilt adjustment mechanism 513 is configured to rotate the grating 51 around an axis substantially parallel to a dispersion direction DD of the grating 51. The tilt adjustment mechanism 523 is configured to rotate the grating 52 around an axis substantially parallel to the dispersion direction, which is not shown, of the grating 52. The tilt adjustment mechanisms 513 and 523 each include, for example, a micrometer. The dispersion direction of a grating refers to the direction in which the grating's light diffraction direction disperses in accordance with the wavelength of the light. The rotation mechanisms 512 and 522 adjust the dispersion direction DD of the grating 51 and the dispersion direction of the grating 52 so as to be slightly different from each other, whereas the axis around which the tilt adjustment mechanism 513 rotates the grating 51 and the axis around which the tilt adjustment mechanism 523 rotates the grating 52 may be parallel to each other or coincide with each other. The drawings illustrate the rotation mechanisms 512 and 522 and the tilt adjustment mechanisms 513 and 523 to show that the number of rotation mechanisms and the number of tilt adjustment mechanisms each correspond to the number of gratings, but do not intend to depict the exact shapes and arrangements of the mechanisms.

The grating 51 corresponds to the first grating in the present disclosure, and the grating 52 corresponds to the second grating in the present disclosure. The surface, of the grating 51, on which the first portion B1 is incident corresponds to the first region in the present disclosure, and the surface, of the grating 52, on which the second portion B2 is incident corresponds to the second region in the present disclosure.

2.2 Operation

The light beam having exited via the window 10a travels through the interior of the line narrowing apparatus 14a while gradually spreading in the direction of the axis V, and is incident on the gratings 51 and 52 in some cases, as shown in FIG. 5B. The gratings 51 and 52 are so disposed that the planes 51p and 52p intersect with each other at a position facing the front side of the gratings 51 and 52. The light beam diffracted by the gratings 51 and 52 therefore, for example, travels through the interior of the line narrowing apparatus 14a with the amount of spread of the light in the direction of the axis V suppressed, and enters the laser chamber 10. The light instead travels through the interior of the line narrowing apparatus 14a with the spread gradually reduced in the direction of the axis V, and enters the laser chamber 10. An increase in the distance in the direction of the axis V between the optical path axis of the first portion B1 and the optical path axis of the second portion B2 of the light beam diffracted by the gratings 51 and 52 is thus suppressed. When the light beam containing the first portion B1 and the second portion B2 is incident on the gratings 51 and 52 while spreading in the direction of the axis V, it is desirable that the direction of the grooves of the grating 51 is perpendicular to the optical path axis of the first portion B1. It is further desirable that the direction of the grooves of the grating 52 is perpendicular to the optical path axis of the second portion B2.

The tilt adjustment mechanism 513 rotates the grating 51 around an axis substantially parallel to the dispersion direction DD of the grating 51, and the tilt adjustment mechanism 523 rotates the grating 52 around an axis substantially parallel to the dispersion direction of the grating 52 to adjust the angle between the optical path axis of the first portion B1 and the optical path axis of the second portion B2 of the light beam caused to return to the laser chamber 10. The tilt adjustment mechanisms 513 and 523 each correspond to the actuator in the present disclosure.

The laser control processor 30 controls the tilt adjustment mechanisms 513 and 523 based on the data on the measured pulse energy outputted from the photodetector 17 in such a way that the pulse energy is maximized.

Based on the target value $\lambda 1t$ of the first wavelength $\lambda 1$ and the data on the measured first wavelength $\lambda 1$ outputted from the photodetector 17, the laser control processor 30 controls the rotation mechanism 512 in such a way that the first wavelength $\lambda 1$ approaches the target value $\lambda 1t$.

In the other respects, the configurations and operations in the first embodiment are the same as those in Comparative Example.

2.3 Effects

According to the first embodiment, the line narrowing apparatus 14a includes the gratings 51 and 52, on which the first portion B1 and the second portion B2, which form the light beam having exited out of the laser chamber 10 and which pass through different positions in the direction in which the electrodes 11a and 11b face each other or in the direction of the grooves of the grating 51, are incident, respectively. The gratings 51 and 52 are configured to suppress an increase in the distance between the optical path axis of the first portion B1 and the optical path axis of the second portion B2. The situation in which part of the light beam spreading by too large amount in the direction of the axis V cannot return to the laser chamber 10 is thus suppressed. The decrease in the pulse energy of the pulsed laser beam can thus be suppressed.

According to the first embodiment, the gratings 51 and 52 are disposed at different positions in the direction in which the electrodes 11a and 11b face each other or in the direction of the grooves of the grating 51, and the light beam having exited out of the laser chamber 10 is incident across the gratings 51 and 52. The planes 51p and 52p, which pass through the respective portions of the gratings 51 and 52 and are perpendicular to the direction of the grooves of the respective gratings 51 and 52, intersect with each other in a position facing the front side of the gratings 51 and 52. Therefore, when the light beam incident on the gratings 51 and 52 while spreading in the direction of the axis V is diffracted by the gratings 51 and 52 and returns to the laser chamber 10, further spread of the light beam in the direction of the axis V is suppressed. The gratings 51 and 52 can provide both the function of separately setting the angles of incidence $\theta\lambda 1$ and $\theta\lambda 2$ for the two-wavelength oscillation and the function of suppressing the spread of the light beam in the direction of the axis V.

According to the first embodiment, the planes 51p and 52p perpendicular to the direction of the grooves of the respective gratings 51 and 52 intersect with each other in the range greater than or equal to 0.06 degrees but smaller than or equal to 0.1 degrees. The number of surviving light rays can thus be maximized in the optical resonator when the light rays travel back and forth the predetermined number of times.

According to the first embodiment, the line narrowing apparatus 14a includes the tilt adjustment mechanisms 513 and 523 as the actuator for adjusting the angle between the optical path axis of the first portion B1 and the optical path axis of the second portion B2. Therefore, even when the light beam containing the first portion B1 and the second portion B2 is incident on the gratings 51 and 52 while spreading in the direction of the axis V, the angle between the optical path axis of the first portion B1 and the optical path axis of the second portion B2 can be adjusted to suppress further spread of the light beam in the direction of the axis V.

According to the first embodiment, the line narrowing apparatus 14a includes the photodetector 17, which detects the pulse energy of the pulsed laser light outputted from the optical resonator, and the laser control processor 30, which controls the tilt adjustment mechanisms 513 and 523 based on the pulse energy detected by the photodetector 17. The angle between the optical path axis of the first portion B1 and the optical path axis of the second portion B2 can therefore be so adjusted that the pulse energy of the pulsed laser beam is maximized.

2.4 Variation

Figure 7:
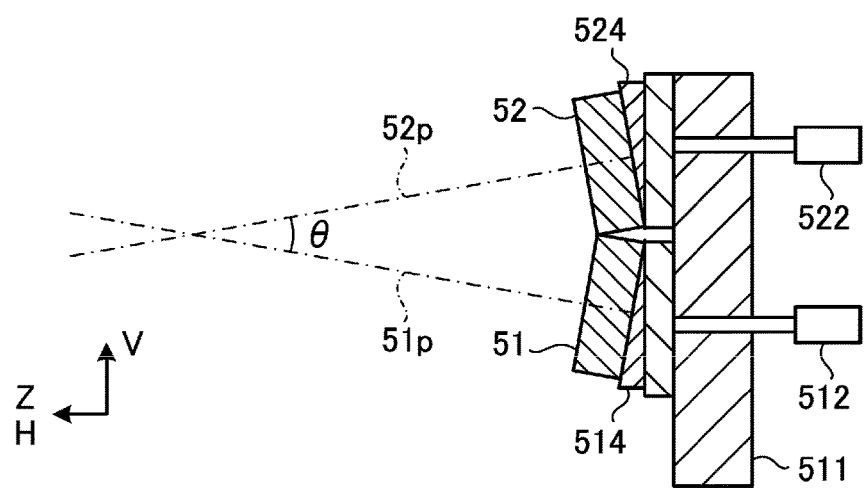
FIG. 7 is a cross-sectional view of gratings and portions therearound in a variation of the first embodiment.

FIG. 7 is a cross-sectional view of the gratings 51 and 52 and portions therearound in a variation of the first embodiment. FIG. 7 shows the portion corresponding to FIG. 5C in the first embodiment.

In the variation, a shim 514 is disposed between the grating 51 and the holder 511, and a shim 524 is disposed between the grating 52 and the holder 511. The tilt adjustment mechanisms 513 and 523 may not be provided.

According to the variation, the postures of the gratings 51 and 52 can be maintained fixed in the simple configuration that does not include the tilt adjustment mechanism 513 or 523. The grating angular difference θ can also be changed by stopping the operation of the narrowed-line gas laser apparatus 1 and replacing the shims 514 and 524.

2.5 Other Configuration Examples

In the first embodiment and the variation thereof, the laser oscillation performed at two wavelengths, the first wavelength $\lambda 1$ and the second wavelength $\lambda 2$, has been described, but not necessarily in the present disclosure. For example, a third grating may be disposed between the gratings 51 and 52, and the third grating may be rotatable around an axis parallel to the axis V to achieve three-wavelength laser oscillation.

In the first embodiment and the variation thereof, the gratings 51 and 52 are rotatable around an axis parallel to the axis V with the posture of the prism 43 maintained fixed, but not necessarily in the present disclosure. The prism 43 and the grating 52 may be rotatable around an axis parallel to the axis V, as in Comparative Example, and in this case, the rotation mechanism 512, which rotates the grating 51 around an axis parallel to the axis V, may not be provided.

3. Narrowed-Line Gas Laser Apparatus Including Two Tilted Prisms

3.1 Configuration

Figure 8A:
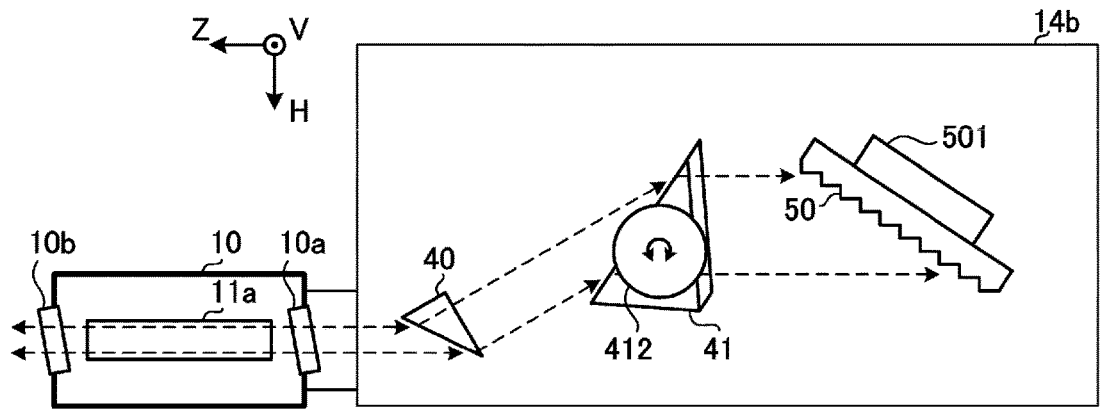
FIGS. 8A and 8B schematically show the configuration of a line narrowing apparatus in a second embodiment.
Figure 8B:
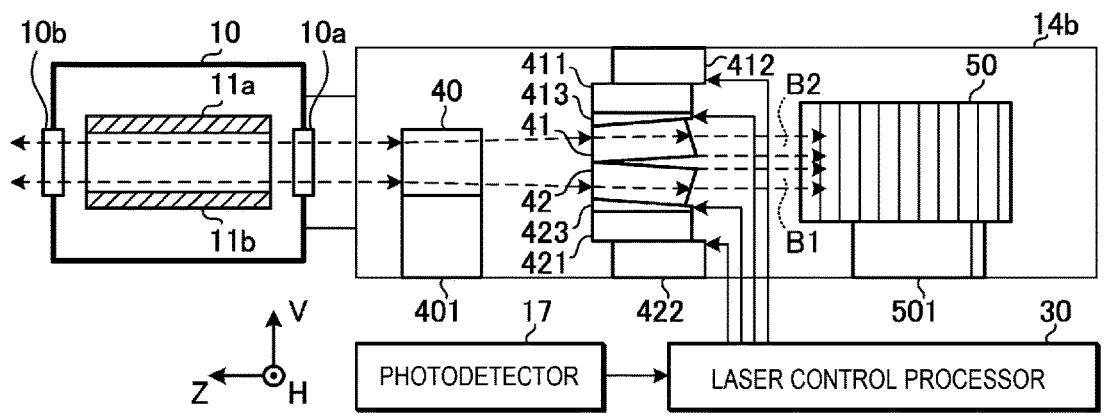

FIGS. 8A and 8B schematically show the configuration of a line narrowing apparatus 14b in a second embodiment. FIGS. 8A and 8B further show the configuration of another portion of the narrowed-line gas laser apparatus 1. FIG. 8A shows the line narrowing apparatus 14b viewed in the direction −V, and FIG. 8B shows the line narrowing apparatus 14b viewed in the direction −H.

The line narrowing apparatus 14b in the second embodiment includes prisms 41 and 42 in place of the prism 43 in the first embodiment, and a grating 50 in place of the gratings 51 and 52 in the first embodiment. The prism 41 corresponds to the first prism in the present disclosure, and the prism 42 corresponds to the second prism in the present disclosure. The grating 50 corresponds to the first grating in the present disclosure.

The prisms 41 and 42 are disposed in the optical path between the prism 40 and the grating 50 in positions different from each other in the direction of the axis V. For example, the prisms 41 and 42 are arranged in this order along the direction −V. The direction −V corresponds to the first direction in the present disclosure. The prism 41 is supported by a holder 411, and the prism 42 is supported by a holder 421.

The prisms 41 and 42 are made of a material having high transmittance for the wavelength selected by the line narrowing apparatus 14b, such as calcium fluoride or synthetic quartz.

The prisms 41 and 42 are so disposed that the light beam having exited via the window 10a and passed through the prism 40 is incident on across the prisms 41 and 42. It is assumed that the portion of the light beam incident on the prism 42 is a first portion B1, and that the portion of the light beam incident on the prism 41 is a second portion B2.

The prism 41 is so disposed that a surface of the prism 41, the surface on which the light beam is incident and via which the light beam exits, slightly inclines with respect to a plane parallel to the axis V and intersects with the axis V. The prism 42 is so disposed that a surface of the prism 42, the surface via which the light beam enters and exits, slightly tilts with respect to a plane parallel to the axis V and intersects with the axis V.

Figure 8C:
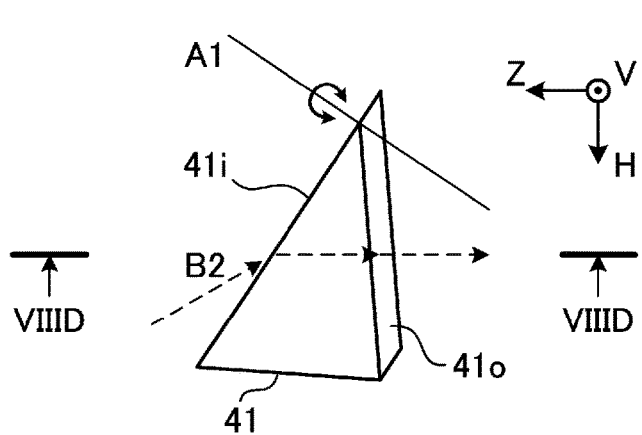
FIG. 8C shows a prism shown in FIG. 8A and an optical path axis of a second portion of a light beam passing through the prism.
Figure 8D:
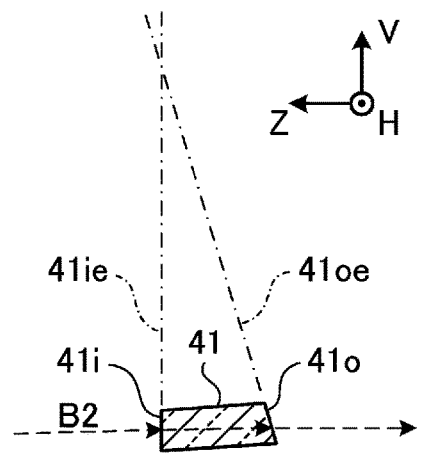
FIG. 8D is a cross-sectional view of the prism taken along the line VIIID-VIIID in FIG. 8C.

FIG. 8C shows the prism 41 shown in FIG. 8A and the optical path axis of the second portion B2 of the light beam passing through the prism 41. FIG. 8D is a cross-sectional view of the prism 41 taken along the line VIIID-VIIID in FIG. 8C and further shows the optical path axis of the second portion B2 of the light beam passing through the prism 41. FIG. 8C shows the prism 41 viewed in the direction −V, and the cross section of the prism 41 taken along the line VIIID-VIIID is parallel to the axis V. The cross section taken along the line VIIID-VIIID is a cross section along the optical path axis of the second portion B2 of the light beam passing through the prism 41. The prism 41 is so disposed that at least one of a light incident surface 41i, on which the second portion B2 of the light beam from the prism 40 is incident, and a light exiting surface 41o, via which the second portion B2 exits toward the grating 50, slightly inclines with respect to a plane parallel to the axis V and intersects with the axis V. In the present specification, the light incident surface is defined as a prism surface through which the light beam passes when the light beam enters the prism from outside, and the light exiting surface is defined as a prism surface through which the light beam passes when the light beam exits from the interior of the prism to the exterior thereof.

Out of the four edges of the quadrangular cross-sectional shape of the prism 41 shown in FIG. 8D, straight lines that are extensions of one edge formed of the light incident surface 41i and one edge formed of the light exiting surface 41o are called straight lines 41ie and 41oe. The prism 41 is so disposed that the two extended straight lines 41ie and 41oe intersect with each other at a position shifted in the direction +V from the position of the prism 41. In FIGS. 8A to 8D, the tilt of the prism 41 is greatly exaggerated. The prism 42 takes, for example, a posture that allows the prisms 41 and 42 to be mirror-symmetric with respect to a plane parallel to the plane HZ.

The light incident surface 41i of the prism 41, the surface on which the second portion B2 is incident, corresponds to the first region in the present disclosure. The light incident surface of the prism 42, the surface which is not shown but on which the first portion B1 is incident, corresponds to the second region in the present disclosure.

The prism 41 is rotatable around an axis different in direction from the axis V with the aid of a tilt adjustment mechanism 413. The prism 42 is rotatable around an axis different in direction from the axis V with the aid of a tilt adjustment mechanism 423.

FIG. 8C shows an example of an axis of rotation A1, around which the prism 41 is rotated by the tilt adjustment mechanism 413. The axis of rotation A1 may be perpendicular to the axis V. The axis of rotation A1 may be perpendicular to the light incident surface 41i, on which the second portion B2 of the light beam from the prism 40 is obliquely incident. When the axis of rotation A1 is perpendicular to the light incident surface 41i, and when the tilt adjustment mechanism 413 tilts the prism 41, the tilt of the light exiting surface 41o, via which the second portion B2 exits out of the prism 41 toward the grating 50, changes, but the light incident surface 41i remains perpendicular to the axis of rotation A1. Variation in the selected wavelength caused by the rotation of the prism 41 rotated by the tilt adjustment mechanism 413 can therefore be suppressed.

The axis of rotation of the prism 42 rotated by the tilt adjustment mechanism 423 is not shown but may, for example, be parallel to the axis of rotation A1. Variation in the selected wavelength caused by the rotation of the prism 42 rotated by the tilt adjustment mechanism 423 can therefore be suppressed.

The prism 41 is rotatable around an axis parallel to the axis V with the aid of a rotation mechanism 412, and the prism 42 is rotatable around an axis parallel to the axis V with the aid of a rotation mechanism 422.

The grating 50 is so supported by a holder 501 that the posture of the grating 50 is maintained fixed. The direction of the grooves of the grating 50 coincides with the direction of the axis V. None of the rotation mechanisms 512 and 522 and the tilt adjustment mechanisms 513 and 523 (see FIGS. 5A and 5B) may be provided in the second embodiment.

3.2 Operation

The first portion B1 and the second portion B2 of the light beam pass through the prisms 42 and 41, respectively, and exit toward the grating 50.

The second portion B2 of the light beam, the portion that enters the prism 41 via the light incident surface 41i and exits out of the prism 41 via the light exiting surface 41o, is refracted clockwise in FIG. 8D. That is, the directional component in the direction +V of the traveling direction of the second portion B2 is suppressed, or the directional component in the direction −V of the traveling direction increases.

The first portion B1 of the light beam, the portion that enters the prism 42 from the prism 40 and exits toward the grating 50, is refracted counterclockwise in FIG. 8B. That is, the directional component in the direction −V of the traveling direction of the first portion B1 is suppressed, or the directional component in the direction +V of the traveling direction increases.

For example, the light beam containing the first portion B1 and the second portion B2 enters the prisms 41 and 42 in some cases from the prism 40 while spreading in the direction of the axis V. The prisms 41 and 42 refract the second portion B2 clockwise in FIG. 8D and the first portion B1 counterclockwise in FIG. 8B. The situation in which part of the light beam caused to return from the grating 50 toward the prisms 41 and 42 spreads by too large amount in the direction of the axis V and cannot therefore return to the laser chamber 10 is thus suppressed. The decrease in the pulse energy of the pulsed laser beam can thus be suppressed.

When the prism 41 is rotated by the tilt adjustment mechanism 413 around an axis different in direction from the axis V, the tilt of one or both of the light incident surface 41i and the light exiting surface 41o of the prism 41 changes. The tilt adjustment mechanism 413 thus adjusts the angle between the optical path axis of the first portion B1 and the optical path axis of the second portion B2.

When the prism 42 is rotated by the tilt adjustment mechanism 423 around an axis different in direction from the axis V, the tilt of one or both of the light incident surface and the light exiting surface of the prism 42 changes. The tilt adjustment mechanism 423 thus adjusts the angle between the optical path axis of the first portion B1 and the optical path axis of the second portion B2.

The tilt adjustment mechanisms 413 and 423 each correspond to the actuator in the present disclosure.

The laser control processor 30 controls the tilt adjustment mechanisms 413 and 423 based on the data on the measured pulse energy outputted from the photodetector 17 in such a way that the pulse energy is maximized.

When the prisms 42 and 41 are rotated around the axis V by the rotation mechanisms 422 and 412, respectively, the angles of incidence of the first portion B1 and the second portion B2 with respect to the grating 50 change. The first wavelength λ1 of the light returning from the grating 50 to the prism 42 and the second wavelength λ2 of the light returning from the grating 50 to the prism 41 thus change.

Based on the target value λ1t of the first wavelength λ1 and the data on the measured first wavelength λ1 outputted from the photodetector 17, the laser control processor 30 controls the rotation mechanism 422 in such a way that the first wavelength λ1 approaches the target value λ1t.

Based on the target value λ2t of the second wavelength λ2 and the data on the measured second wavelength λ2 outputted from the photodetector 17, the laser control processor 30 controls the rotation mechanism 412 in such a way that the second wavelength λ2 approaches the target value λ2t.

In the other respects, the configurations and operations in the second embodiment are the same as those in the first embodiment.

3.3 Effects

According to the second embodiment, the optical system of the line narrowing apparatus 14b includes the prisms 41 and 42 sequentially arranged in the direction −V being a direction from one electrode 11a toward the other electrode 11b or in the direction −V along the grooves of the grating 51. The prisms 41 and 42 are so disposed that the light beam having exited out of the laser chamber 10 is incident across the prisms 41 and 42. In a cross section of the prism 41, the cross section parallel to the direction −V and extending along the optical path axis of the second portion B2 of the light beam in the prism 41, when two edges of the cross section, the edges on which the second portion B2 of the light beam is incident and via which the second portion B2 exits, are extended, the two extended straight lines 41ie and 41oe intersect with each other at a position shifted from the position of the prism 41 in the direction opposite the direction −V. A decrease in the number of surviving light rays in the optical resonator can thus be reduced without rotation of the two gratings 51 and 52 (see FIGS. 5A and 5B) around an axis substantially parallel to the dispersion directions of the gratings 51 and 52, whereby a decrease in the pulse energy of the pulsed laser light can be suppressed.

3.4 Other Configuration Examples

In the second embodiment, the laser oscillation performed at two wavelengths, the first wavelength λ1 and the second wavelength λ2, has been described, but not necessarily in the present disclosure. For example, a third prism may be disposed between the prisms 41 and 42, and the third prism may be rotatable around an axis parallel to the axis V to achieve three-wavelength laser oscillation.

In the second embodiment, the prisms 41 and 42 are rotatable around an axis parallel to the axis V with the posture of the grating 50 maintained fixed, but not necessarily in the present disclosure. In place of the grating 50, the gratings 51 and 52 (see FIGS. 5A and 5B) rotatable around an axis parallel to the axis V may be provided, and the prisms 41 and 42 may be rotatable only around an axis different from the axis V with the aid of the tilt adjustment mechanisms 413 and 423. In this case, none of the rotation mechanisms 412 and 422, which rotate the prisms 41 and 42 around an axis parallel to the axis V, may be provided.

In the second embodiment, the prisms 41 and 42 are rotatable with the aid of the tilt adjustment mechanisms 413 and 423, but not necessarily in present disclosure. Shims that are not shown may be disposed between the prism 41 and the holder 411 and between the prism 42 and the holder 421.

4. Narrowed-Line Gas Laser Apparatus Including One Tilted Prism and One Tilted Grating

4.1 Configuration

Figure 9A:
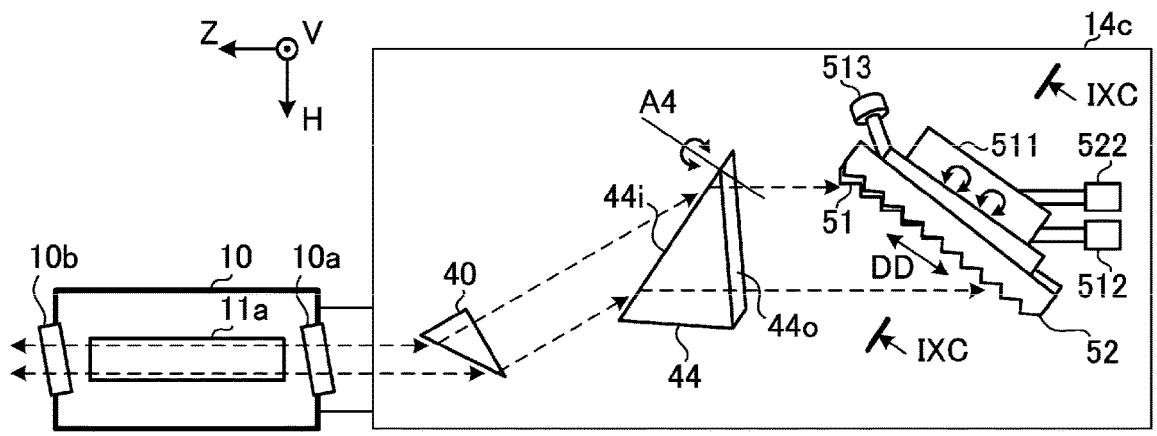
FIGS. 9A and 9B schematically show the configuration of a line narrowing apparatus in a third embodiment.
Figure 9B:
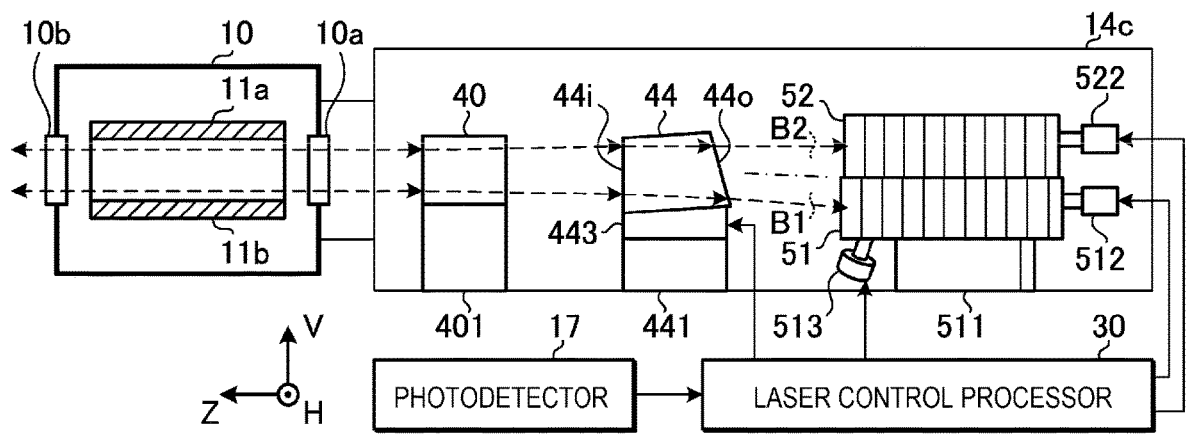

FIGS. 9A and 9B schematically show the configuration of a line narrowing apparatus 14c in a third embodiment. FIGS. 9A and 9B further show the configuration of another portion of the narrowed-line gas laser apparatus 1. FIG. 9A shows the line narrowing apparatus 14c viewed in the direction −V, and FIG. 9B shows the line narrowing apparatus 14c viewed in the direction −H.

The line narrowing apparatus 14c in the third embodiment includes a prism 44 in place of the prism 43 in the first embodiment.

The prism 44 is supported by a holder 441. The prism 44 is made of a material having high transmittance for the wavelength selected by the line narrowing apparatus 14c, such as calcium fluoride or synthetic quartz.

The prism 44 is so disposed that at least one of a light incident surface 44i, on which the light beam from the prism 40 is incident, and a light exiting surface 44o, via which the light beam exits toward the gratings 51 and 52, slightly inclines with respect to a plane parallel to the axis V and intersects with the axis V.

The gratings 51 and 52 are disposed in the optical path of the light beam having passed through the prism 44 in positions different from each other in the direction of the axis V. The positions of the gratings 51 and 52 are so set that the light beam having passed through the prism 44 is incident across the gratings 51 and 52.

Figure 9C:
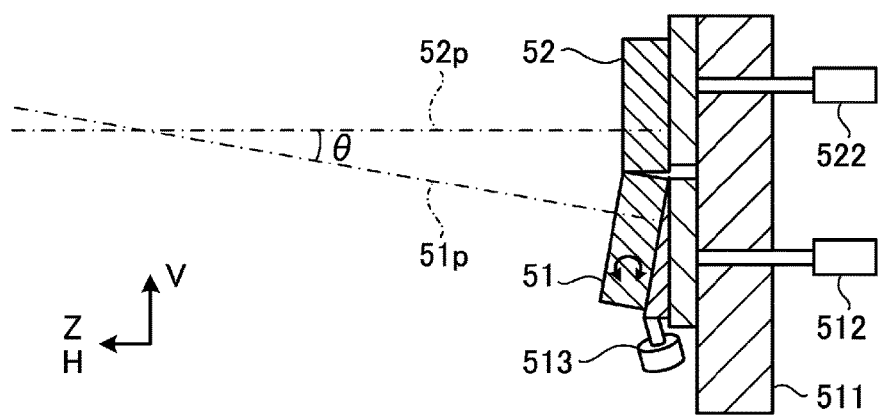
FIG. 9C is a cross-sectional view of the line narrowing apparatus taken along the line IXC-IXC in FIG. 9A.

FIG. 9C is a cross-sectional view of the line narrowing apparatus taken along the line IXC-IXC in FIG. 9A. The grating 51 is so disposed that the plane 51p passing through part of the grating 51 and perpendicular to the direction of the grooves of the grating 51 slightly inclines with respect to the plane HZ. The grating 52 is so disposed that the plane 52p passing through part of the grating 52 and perpendicular to the direction of the grooves of the grating 52 is substantially parallel to the plane HZ. That is, the direction of the grooves of the grating 52 is substantially parallel to the axis V. The planes 51p and 52p intersect with each other at a position facing the front side of the gratings 51 and 52. The front side of the gratings 51 and 52 corresponds to the left side in FIG. 9C, that is, the light beam incident side. The angle between the planes 51p and 52p is called a grating angular difference $\theta$. In FIG. 9C, the angular difference $\theta$ is drawn in a greatly exaggerated manner.

The prism 44 is rotatable around an axis different in direction from the axis V with the aid of a tilt adjustment mechanism 443.

FIG. 9A shows an example of an axis of rotation A4, around which the prism 44 is rotated by the tilt adjustment mechanism 443. The axis of rotation A4 may be perpendicular to the axis V. The axis of rotation A4 may be perpendicular to the light incident surface 44i, on which the light beam from the prism 40 is obliquely incident. When the axis of rotation A4 is perpendicular to the light incident surface 44i, and when the tilt adjustment mechanism 443 tilts the prism 44, the tilt of the light exiting surface 44o, via which the light beam exits out of the prism 44 toward the gratings 51 and 52, changes, but the light incident surface 44i remains perpendicular to the axis of rotation A4. Variation in the selected wavelength caused by the rotation of the prism 44 rotated by the tilt adjustment mechanism 443 can therefore be suppressed.

The grating 51 is rotatable around an axis substantially parallel to the dispersion direction DD of the grating 51 with the aid of the tilt adjustment mechanism 513. In the third embodiment, the tilt adjustment mechanism 523 (see FIGS. 5A to 5C), which rotates the grating 52 around an axis substantially parallel to the dispersion direction thereof, may not be provided.

The rotation mechanisms 512 and 522 allow the gratings 51 and 52 to rotate around an axis parallel to the axis V.

4.2 Operation

The light beam having passed through the prism 44 is incident on the gratings 51 and 52 while spreading in the direction of the axis V in some cases. Out of the light beam, the portion to be incident on the grating 51 is the first portion B1, and the portion to be incident on the grating 52 is the second portion B2. The gratings 51 and 52 are so disposed that the planes 51p and 52p intersect with each other at a position facing the front side of the gratings 51 and 52, as described above. An increase in the distance in the direction of the axis V between the optical path axis of the first portion B1 and the optical path axis of the second portion B2 of the light beam diffracted by the gratings 51 and 52 is thus suppressed.

When the prism 44 is rotated by the tilt adjustment mechanism 443 around an axis different in direction from the axis V, the tilt of one or both of the light incident surface 44i and the light exiting surface 44o of the prism 44 changes.

The angle of refraction of the light beam refracted by the prism 44 thus changes. The prism 44 rotates the optical path axis of the light beam clockwise or counterclockwise in FIG. 9B. That is, the prism 44 rotates the optical path axis of the light beam in a direction containing a directional component in the direction –V or +V.

When the tilt adjustment mechanism 513 rotates the grating 51 around an axis substantially parallel to the dispersion direction DD of the grating 51, the tilt of the plane 51p with respect to the plane HZ changes. The grating angular difference $\theta$ thus changes.

Let $\theta c$ be the inclination of the optical path axis of the light beam that exits out of the prism 44 with respect to the plane HZ, and the angular difference between the optical path axis of the light beam that exits out of the prism 44 and the plane 52p is $\theta c$, and the angular difference between the optical path axis of the light beam and the plane 51p is $\theta - \theta c$. When the tilt adjustment mechanism 443 rotates the prism 44, the value of $\theta c$ changes. When the tilt adjustment mechanism 513 rotates the grating 51 around an axis substantially parallel to the dispersion direction DD of the grating 51, the value of $\theta$ changes. The value of $\theta c$ is set, for example, at half the value of $\theta$. Appropriately setting the values of $\theta$ and $\theta c$ allows an increase in the number of surviving light rays in the optical resonator, whereby the wasted energy can be suppressed. As described above, when the tilt adjustment mechanism 443 rotates the prism 44 around an axis different in direction from the axis V, and the tilt adjustment mechanism 513 rotates the grating 51 around an axis substantially parallel to the dispersion direction DD of the grating 51, the angle between the optical path axis of the first portion B1 and the optical path axis of the second portion B2 is adjusted. The tilt adjustment mechanisms 443 and 513 each correspond to the actuator in the present disclosure.

The laser control processor 30 controls the tilt adjustment mechanisms 443 and 513 in such a way that the pulse energy is maximized based on the data on the measured pulse energy outputted from the photodetector 17.

Based on the target value $\lambda 1t$ of the first wavelength $\lambda 1$ and the data on the measured first wavelength $\lambda 1$ outputted from the photodetector 17, the laser control processor 30 controls the rotation mechanism 512 in such a way that the first wavelength $\lambda 1$ approaches the target value $\lambda 1t$.

Based on the target value $\lambda 2t$ of the second wavelength $\lambda 2$ and the data on the measured second wavelength $\lambda 2$ outputted from the photodetector 17, the laser control processor 30 controls the rotation mechanism 522 in such a way that the second wavelength $\lambda 2$ approaches the target value $\lambda 2t$.

In the other respects, the configurations and operations in the third embodiment are the same as those in the first embodiment.

4.3 Effects

According to the third embodiment, the line narrowing apparatus 14c includes the prism 44, which refracts the light beam having exited out of the laser chamber 10 in a direction containing a directional component in the direction in which the electrodes 11a and 11b face each other or a directional component in the direction of the grooves of the grating 51.

The line narrowing apparatus 14c includes the gratings 51 and 52 disposed in different positions in the direction in which the electrodes 11a and 11b face each other or in the direction of the grooves of the grating 51. The gratings 51 and 52 are so disposed that the light beam having exited out of the laser chamber 10 and passed through the prism 44 is incident across the gratings 51 and 52. The gratings 51 and 52 are so disposed that the planes 51p and 52p, which pass through the respective portions of the gratings 51 and 52 and are perpendicular to the direction of the grooves of the respective gratings 51 and 52, intersect with each other at a position facing the front side of the gratings 51 and 52.

The situation in which part of the light beam spreading by too large amount in the direction of the axis V cannot return to the laser chamber 10 is thus suppressed. The decrease in the pulse energy of the pulsed laser beam can thus be suppressed.

4.4 Other Configuration Examples

In the third embodiment, the laser oscillation at two wavelengths, the first wavelength λ1 and the second wavelength 2, has been described, but not necessarily in the present disclosure. For example, a third grating may be disposed between the gratings 51 and 52, and the third grating may be rotatable around an axis parallel to the axis V to achieve three-wavelength laser oscillation.

In the third embodiment, the prism 44 is rotatable with the aid of the tilt adjustment mechanism 443 only around an axis different from the axis V, but not necessarily in present disclosure. The prism 44 may also be rotatable around an axis parallel to the axis V. In this case, the rotation mechanism 512, which rotates the grating 51 around an axis parallel to the axis V, may not be provided.

In the third embodiment, the prism 44 and the grating 51 are rotatable with the aid of the tilt adjustment mechanisms 443 and 513, but not necessarily in present disclosure. Shims that are not shown may be disposed between the prism 44 and the holder 441 and between the grating 51 and the holder 511.

5. Narrowed-Line Gas Laser Apparatus Including Two Tilted Mirrors

5.1 Configuration

Figure 10A:
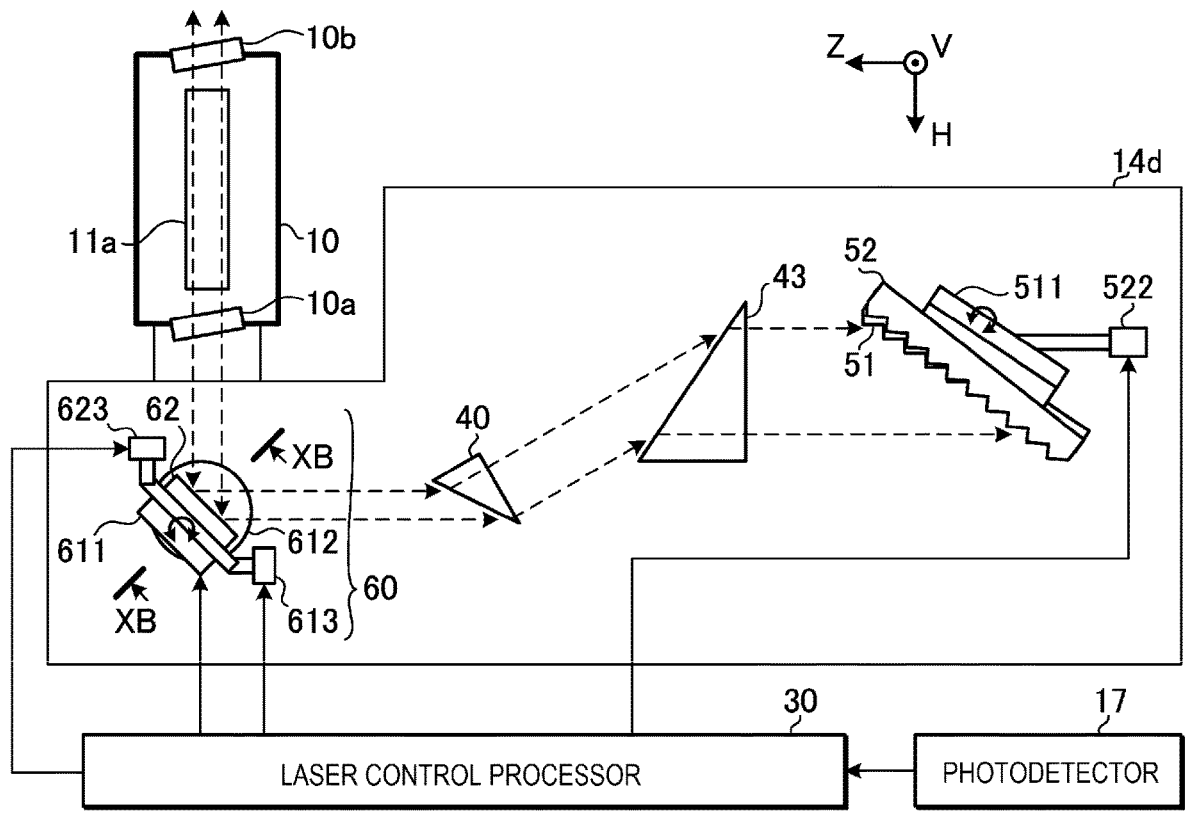
FIG. 10A schematically shows the configuration of a line narrowing apparatus in a fourth embodiment.

FIG. 10A schematically shows the configuration of a line narrowing apparatus 14d in a fourth embodiment. FIG. 10A further shows the configuration of another portion of the narrowed-line gas laser apparatus 1. FIG. 10A shows the line narrowing apparatus 14d viewed in the direction −V. In FIG. 10A, the traveling direction of the light beam having exited via the window 10a is the direction +H. The traveling direction of the pulsed laser light having exited via the window 10b and outputted via the output coupling mirror 15 is the direction −H.

In the fourth embodiment, a mirror system 60 is provided in the optical path of the light beam between the laser chamber 10 and the prism 40.

Figure 10B:
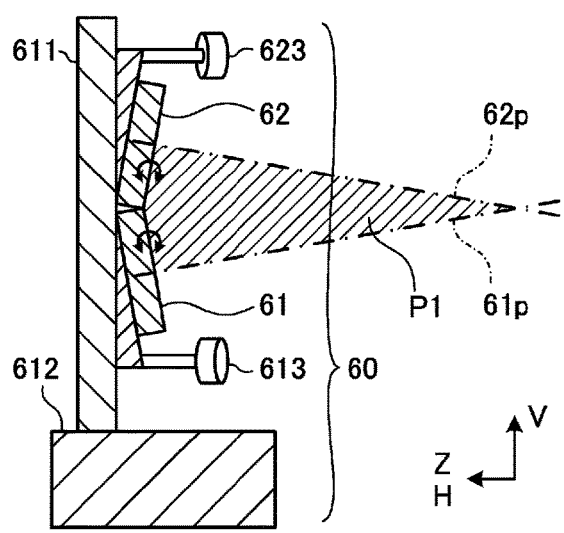
FIG. 10B is a cross-sectional view of the line narrowing apparatus taken along the line XB-XB in FIG. 10A.

FIG. 10B is a cross-sectional view of the mirror system 60 taken along the line XB-XB in FIG. 10A. The mirror system 60 includes two mirrors 61 and 62. The mirrors 61 and 62 are disposed in the optical path of the light beam having exited via the window 10a in positions different from each other in the direction of the axis V.

Figure 10C:
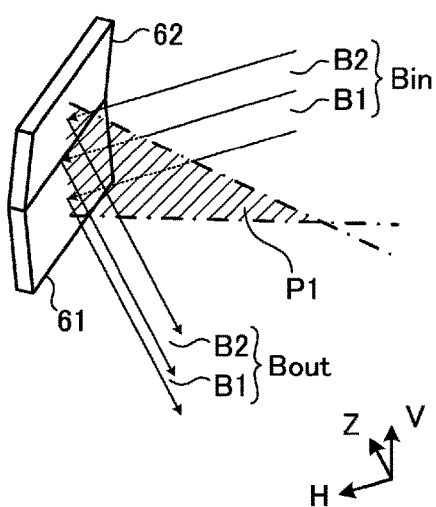
FIG. 10C is a perspective view showing the arrangement of mirrors.

FIG. 10C is a perspective view showing the arrangement of the mirrors 61 and 62. The mirrors 61 and 62 are so disposed that a plane P1 perpendicular to both the mirrors 61 and 62 is parallel to the axis V. The cross section shown in FIG. 10B is parallel to the plane P1. The mirror 61 corresponds to the first mirror in the present disclosure, and the mirror 62 corresponds to the second mirror in the present disclosure.

The mirrors 61 and 62 are supported by a holder 611. A first plane 61p, which is perpendicular to both the mirror 61 and the plane P1, and a second plane 62p, which is perpendicular to both the mirror 62 and the plane P1, both slightly incline with respect to the plane HZ. The first plane 61p and the second plane 62p intersect with each other at a position facing the front side of the mirrors 61 and 62. The front side of the mirrors 61 and 62 corresponds to the right side in FIG. 10B, that is, the light beam incident side.

The mirror 61 is rotatable in the plane P1 perpendicular to both the mirrors 61 and 62 with the aid of a tilt adjustment mechanism 613. The mirror 62 is rotatable in the plane P1 perpendicular to both the mirrors 61 and 62 with the aid of a tilt adjustment mechanism 623.

The mirrors 61 and 62 are rotatable around an axis parallel to the axis V with the aid of a rotation mechanism 612.

The grating 52 is rotatable around an axis parallel to the axis V with the aid of the rotation mechanism 522. In the fourth embodiment, the rotation mechanism 512, which rotates the grating 51 around an axis parallel to the axis V, and the tilt adjustment mechanisms 513 and 523 (see FIGS. 5A to 5C), which rotate the gratings 51 and 52 around axes substantially parallel to the dispersion directions thereof, may not be provided. The direction of the grooves of the gratings 51 and 52 may coincide with the direction of the axis V.

5.2 Operation

A light beam Bin (see FIG. 10C) having exited via the window 10a in the direction +H is incident across the mirrors 61 and 62. Out of the light beam Bin, it is assumed that the portion incident on the mirror 61 is a first portion B1, and that the portion incident on the mirror 62 is a second portion B2. The light beam Bin containing the first portion B1 and the second portion B2 is reflected off the mirrors 61 and 62 in the direction −Z as a light beam Bout, which enters the prism 40. The surface of the mirror 61 on which the first portion B1 is incident corresponds to the first region in the present disclosure, and the surface of the mirror 62 on which the second portion B2 is incident corresponds to the second region in the present disclosure.

For example, the light beam Bin containing the first portion B1 and the second portion B2 is incident on the mirrors 61 and 62 from the window 10a while spreading in the direction of the axis V in some cases. That is, the first portion B1 incident on the mirror 61 has a directional component in the direction −V in some cases, and the second portion B2 incident on the mirror 62 has a directional component in the direction +V in some cases. The mirror 61 reflects the first portion B1 in the direction having the directional component in the direction +V or reflects the first portion B1 with a directional component in the direction −V suppressed. The mirror 62 reflects the second portion B2 in the direction having a directional component in the direction −V or reflects the second portion B2 with a directional component in the direction +V suppressed. The situation in which part of the light beam caused to return from the gratings 51 and 52 and spreading by too large amount in the direction of the axis V cannot return to the laser chamber 10 is thus suppressed. The decrease in the pulse energy of the pulsed laser beam can thus be suppressed. Appropriately setting the inclination of the mirrors 61 and 62 allows an increase in the number of surviving light rays in the optical resonator, whereby the wasted energy can be suppressed.

The tilt adjustment mechanism 613 rotates the mirror 61 in the plane P1 perpendicular to both the mirrors 61 and 62, and the tilt adjustment mechanism 623 rotates the mirror 62 in the plane P1 to adjust the angle between the optical path axis of the first portion B1 and the optical path axis of the second portion B2. The tilt adjustment mechanisms 613 and 623 each correspond to the actuator in the present disclosure.

The laser control processor 30 controls the tilt adjustment mechanisms 613 and 623 based on the data on the measured pulse energy outputted from the photodetector 17 in such a way that the pulse energy is maximized.

Based on the target value $\lambda 1t$ of the first wavelength $\lambda 1$ and the data on the measured first wavelength $\lambda 1$ outputted from the photodetector 17, the laser control processor 30 controls the rotation mechanism 612 in such a way that the first wavelength $\lambda 1$ approaches the target value $\lambda 1t$.

Based on the target value $\lambda 2t$ of the second wavelength $\lambda 2$ and the data on the measured second wavelength $\lambda 2$ outputted from the photodetector 17, the laser control processor 30 controls the rotation mechanism 522 in such a way that the second wavelength $\lambda 2$ approaches the target value $\lambda 2t$.

In the other respects, the configurations and operations in the fourth embodiment are the same as those in the first embodiment.

5.3 Effects

According to the fourth embodiment, the line narrowing apparatus 14d includes the mirrors 61 and 62 located at different positions in the direction in which the electrodes 11a and 11b face each other or in the direction of the grooves of the grating 51. The mirrors 61 and 62 are so disposed that the light beam Bin having exited out of the laser chamber 10 is incident across the mirrors 61 and 62. The first plane 61p, which is perpendicular to both the plane P1, which is perpendicular to both the mirrors 61 and 62, and the mirror 61, and the second plane 62p, which is perpendicular to both the plane P1 and the mirror 62, intersect with each other at a position facing the front side of the mirrors 61 and 62. The situation in which part of the light beam spreading by too large amount in the direction of the axis V cannot return to the laser chamber 10 is thus suppressed. The decrease in the pulse energy of the pulsed laser beam can thus be suppressed.

5.4 Other Configuration Examples

In the fourth embodiment, the laser oscillation at two wavelengths, the first wavelength $\lambda 1$ and the second wavelength $\lambda 2$, has been described, but not necessarily in the present disclosure. For example, a third grating may be disposed between the gratings 51 and 52, and the third grating may be rotatable around an axis parallel to the axis V to achieve three-wavelength laser oscillation.

In the fourth embodiment, the postures of the prism 43 and the grating 51 are maintained fixed, but not necessarily in the present disclosure. The prism 43 or the grating 51 may be rotatable around an axis parallel to the axis V. In this case, the rotation mechanism 612, which rotates the mirrors 61 and 62 around an axis parallel to the axis V, may not be provided.

In the fourth embodiment, the mirror system 60 including the mirrors 61 and 62 is disposed in the optical path between the window 10a and the prism 40, but not necessarily in the present disclosure. The mirror system 60 may be disposed in the optical path between the prism 40 and the gratings 51, 52.

In the fourth embodiment, the mirrors 61 and 62 are rotatable with the aid of the tilt adjustment mechanisms 613 and 623, but not necessarily in present disclosure. Shims that are not shown may be disposed between the mirror 61 and the holder 611 and between the mirror 62 and the holder 611.

6. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A narrowed-line gas laser apparatus comprising:
   a laser chamber accommodating a pair of electrodes disposed so as to face each other;
   an output coupling mirror; and
   a line narrowing apparatus forming an optical resonator along with the output coupling mirror, the line narrowing apparatus including an optical system having a first region and a second region on which a first portion and a second portion of a light beam that exits out of the laser chamber are incident, the first and second portions passing through different positions in a direction in which the pair of electrodes face each other, the optical system being configured to suppress an increase in a distance between an optical path axis of the first portion and an optical path axis of the second portion.

2. The narrowed-line gas laser apparatus according to claim 1,
   wherein the line narrowing apparatus is configured to select a first wavelength contained in the first portion and a second wavelength contained in the second portion to perform line narrowing on the light beam.

3. The narrowed-line gas laser apparatus according to claim 1,
   wherein the optical system includes first and second gratings disposed at different positions in the direction in which the pair of electrodes face each other, the first and second gratings are so disposed that the light beam that exits out of the laser chamber is incident across the first and second gratings and that planes passing respectively through portions of the first and second gratings and perpendicular to a direction of grooves of the first and second gratings intersect with each other at a position facing a front side of the first and second gratings.

4. The narrowed-line gas laser apparatus according to claim 3,
wherein the planes perpendicular to the direction of the grooves of the first and second gratings intersect with each other in a range greater than or equal to 0.06 degrees but smaller than or equal to 0.1 degrees.

5. The narrowed-line gas laser apparatus according to claim 3,
wherein the line narrowing apparatus further includes a holder supporting the first and second gratings and a shim disposed between at least one of the first and second gratings and the holder.

6. The narrowed-line gas laser apparatus according to claim 1,
wherein the optical system includes first and second prisms sequentially arranged in a first direction being a direction from one of the pair of electrodes toward the other, the optical system is so disposed that the light beam that exits out of the laser chamber is incident across the first and second prisms, the first prism has a cross section parallel to the first direction and present along an optical path axis of the light beam in the first prism, the cross section has two edges on which a portion of the light beam is incident and via which the portion of the light beam exits, and two straight lines that are extensions of the two edges intersect with each other in a position shifted in a direction opposite the first direction from a position of the first prism.

7. The narrowed-line gas laser apparatus according to claim 1,
wherein the line narrowing apparatus further includes a prism configured to refract the light beam that exits out of the laser chamber in a direction containing a directional component in the direction in which the pair of electrodes face each other, and
the optical system includes first and second gratings disposed at different positions in the direction in which the pair of electrodes face each other, the first and second gratings are so disposed that the light beam that exits out of the laser chamber and passes through the prism is incident across the first and second gratings and that planes passing respectively through portions of the first and second gratings and perpendicular to a direction of grooves of the first and second gratings intersect with each other at a position facing a front side of the first and second gratings.

8. The narrowed-line gas laser apparatus according to claim 1,
wherein the optical system includes first and second mirrors disposed at different positions in the direction in which the pair of electrodes face each other, the first and second mirrors are so disposed that the light beam that exits out of the laser chamber is incident across the first and second mirrors and that a first plane perpendicular to both a plane perpendicular to both the first and second mirrors and the first mirror and a second plane perpendicular to both the plane perpendicular to both the first and second mirrors and the second mirror intersect with each other at a position facing a front side of the first and second mirrors.

9. The narrowed-line gas laser apparatus according to claim 1,
wherein the line narrowing apparatus further includes an actuator configured to adjust an angle between the optical path axis of the first portion and the optical path axis of the second portion.

10. The narrowed-line gas laser apparatus according to claim 9, further comprising:
a photodetector configured to detect pulse energy of pulsed laser light outputted from the optical resonator; and
a processor configured to control the actuator based on the pulse energy detected by the photodetector.

11. A narrowed-line gas laser apparatus comprising:
a laser chamber accommodating a pair of electrodes disposed so as to face each other;
an output coupling mirror; and
a line narrowing apparatus including a first grating and forming an optical resonator along with the output coupling mirror, the line narrowing apparatus including an optical system having a first region and a second region on which a first portion and a second portion of a light beam that exits out of the laser chamber are incident, the first and second portions passing through different positions in a direction of grooves of the first grating, the optical system being configured to suppress an increase in a distance between an optical path axis of the first portion and an optical path axis of the second portion.

12. The narrowed-line gas laser apparatus according to claim 11,
wherein the line narrowing apparatus is configured to select a first wavelength contained in the first portion and a second wavelength contained in the second portion to perform line narrowing on the light beam.

13. The narrowed-line gas laser apparatus according to claim 11,
wherein the optical system includes the first grating and a second grating disposed at a position different from the position of the first grating in the direction of the grooves of the first grating, the first and second gratings are so disposed that the light beam that exits out of the laser chamber is incident across the first and second gratings and that planes passing respectively through portions of the first and second gratings and perpendicular to the direction of the grooves of the first and second gratings intersect with each other at a position facing a front side of the first and second gratings.

14. The narrowed-line gas laser apparatus according to claim 13,
wherein the planes perpendicular to the direction of the grooves of the first and second gratings intersect with each other in a range greater than or equal to 0.06 degrees but smaller than or equal to 0.1 degrees.

15. The narrowed-line gas laser apparatus according to claim 13,
wherein the line narrowing apparatus further includes a holder supporting the first and second gratings and a shim disposed between at least one of the first and second gratings and the holder.

16. The narrowed-line gas laser apparatus according to claim 11,
wherein the optical system includes first and second prisms sequentially arranged in a first direction along the grooves of the first grating, the optical system is so disposed that the light beam that exits out of the laser chamber is incident across the first and second prisms, the first prism has a cross section parallel to the first direction and present along an optical path axis of the light beam in the first prism, the cross section has two edges on which a portion of the light beam is incident and via which the portion of the light beam exits, and two straight lines that are extensions of the two edges intersect with each other in a position shifted in a direction opposite the first direction from a position of the first prism.

17. The narrowed-line gas laser apparatus according to claim 11,
wherein the line narrowing apparatus further includes a prism configured to refract the light beam that exits out of the laser chamber in a direction containing a directional component in the direction along the grooves of the first grating, and
the optical system includes the first grating and a second grating disposed at a position different from the position of the first grating in the direction of the grooves of the first grating, the first and second gratings are so disposed that the light beam that exits out of the laser chamber and passes through the prism is incident across the first and second gratings and that planes passing respectively through portions of the first and second gratings and perpendicular to the direction of the grooves of the first and second gratings intersect with each other at a position facing a front side of the first and second gratings.

18. The narrowed-line gas laser apparatus according to claim 11,
wherein the optical system includes first and second mirrors disposed at different positions in the direction along the grooves of the first grating, the first and second mirrors are so disposed that the light beam that exits out of the laser chamber is incident across the first and second mirrors and that a first plane perpendicular to both a plane perpendicular to both the first and second mirrors and the first mirror and a second plane perpendicular to both the plane perpendicular to both the first and second mirrors and the second mirror intersect with each other at a position facing a front side of the first and second mirrors.

19. The narrowed-line gas laser apparatus according to claim 11,
wherein the line narrowing apparatus further includes an actuator configured to adjust an angle between the optical path axis of the first portion and the optical path axis of the second portion.

20. A method for manufacturing electronic devices, the method comprising:
causing a narrowed-line gas laser apparatus to produce pulsed laser light, the narrowed-line gas laser apparatus including
a laser chamber accommodating a pair of electrodes disposed so as to face each other,
an output coupling mirror, and
a line narrowing apparatus forming an optical resonator along with the output coupling mirror, the line narrowing apparatus including an optical system having a first region and a second region on which a first portion and a second portion of a light beam that exits out of the laser chamber are incident, the first and second portions passing through different positions in a direction in which the pair of electrodes face each other, the optical system being configured to suppress an increase in a distance between an optical path axis of the first portion and an optical path axis of the second portion;
outputting the pulsed laser light to an exposure apparatus; and
exposing a light sensitive substrate with the pulsed laser light in the exposure apparatus to manufacture the electronic devices.

* * * * *